(12) United States Patent
Kim

(10) Patent No.: US 7,242,451 B2
(45) Date of Patent: Jul. 10, 2007

(54) THIN FILM TRANSISTOR ARRAY PANEL

(75) Inventor: Dong-Gyu Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 76 days.

(21) Appl. No.: 10/523,447

(22) PCT Filed: Sep. 18, 2002

(86) PCT No.: PCT/KR02/01760

§ 371 (c)(1),
(2), (4) Date: Oct. 20, 2005

(87) PCT Pub. No.: WO2004/011999

PCT Pub. Date: Feb. 5, 2004

(65) Prior Publication Data

US 2006/0152655 A1    Jul. 13, 2006

(30) Foreign Application Priority Data

Jul. 30, 2002    (KR) ............................... 2002-44940

(51) Int. Cl.
*G02F 1/1343* (2006.01)
(52) U.S. Cl. ..................................................... 349/139
(58) Field of Classification Search ................ 349/43, 349/139
See application file for complete search history.

(56) References Cited

U.S. PATENT DOCUMENTS

| | | | |
|---|---|---|---|
| 5,731,854 A | 3/1998 | Kishida ....................... 349/40 |
| 5,883,682 A * | 3/1999 | Kim et al. ..................... 349/43 |
| 5,930,607 A * | 7/1999 | Satou .......................... 438/158 |
| 6,038,003 A * | 3/2000 | Kim ............................. 349/43 |
| 6,256,077 B1 * | 7/2001 | Baek ............................ 349/43 |

(Continued)

FOREIGN PATENT DOCUMENTS

JP    8-262219    10/1996

OTHER PUBLICATIONS

PCT International Search Report; International application No. PCT/KR02/01760; International filing date: Sep. 18, 2002; Date of Mailing: Jan. 27, 2003.

(Continued)

*Primary Examiner*—James A. Dudek
(74) *Attorney, Agent, or Firm*—Cantor Colburn LLP

(57) ABSTRACT

A thin film transistor array panel according to the present invention includes a first wire, a second wire, and a pixel electrode. The first wire is formed on an insulating substrate and is used as a gate line or a storage capacitor electrode. The second wire overlaps the first wire via a gate insulating layer and is used as a storage capacitor conductor or a drain electrode. The pixel electrode is formed on a passivation layer covering the second wire and is connected to the second wire through a contact hole of a second insulating layer. In order to secure aperture ratio of the pixel and to block light leakage, distances between the boundaries of the contact hole at the place where alignment treatment or rubbing ends and the boundaries of the first wire or the second wire adjacent thereto and located outside the boundaries of the contact hole are designed to be wider than those between the boundaries of the contact hole at the other places and the boundaries of the first wire or the second wire.

10 Claims, 33 Drawing Sheets

U.S. PATENT DOCUMENTS

| | | | |
|---|---|---|---|
| 6,297,519 B1 * | 10/2001 | Fujikawa et al. | 257/59 |
| 6,330,042 B1 * | 12/2001 | Kang et al. | 349/43 |
| 6,330,044 B1 | 12/2001 | Murade | 349/44 |
| 6,366,331 B1 * | 4/2002 | Sakamoto et al. | 349/43 |
| 6,373,546 B1 * | 4/2002 | Kim | 349/152 |
| 6,515,719 B2 * | 2/2003 | Yamaguchi et al. | 349/38 |
| 6,567,150 B1 * | 5/2003 | Kim | 349/187 |

OTHER PUBLICATIONS

PCT International Preliminary Examination Report; International application No. PCT/KR2002/001760; International filing date: Sep. 18, 2002; Date of Completion: Nov. 17, 2004.

* cited by examiner

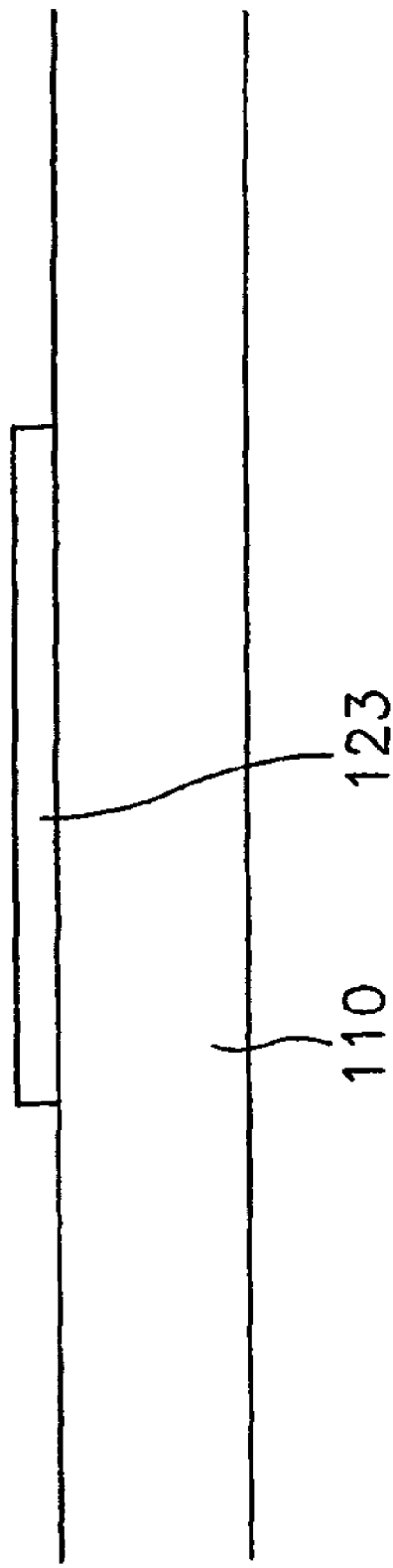

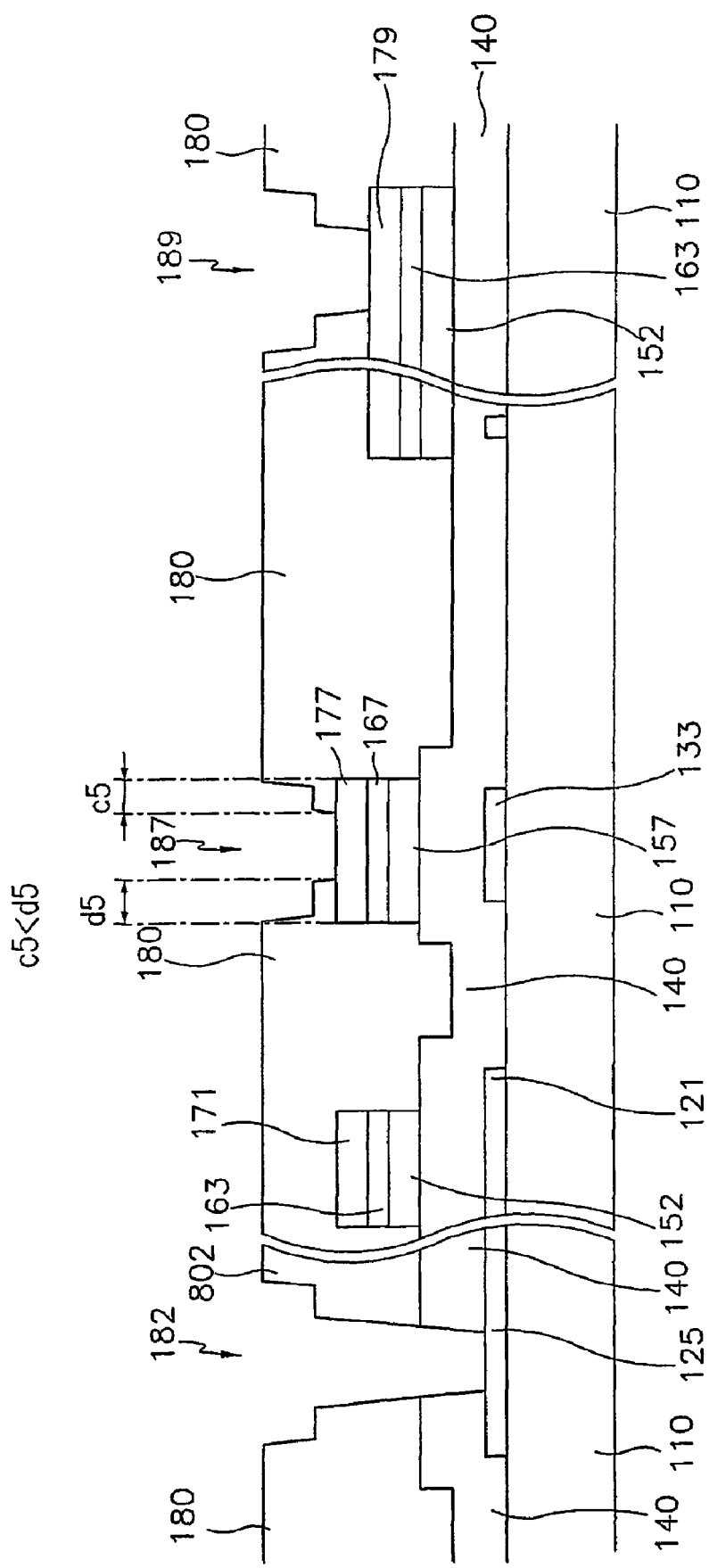

THIN FILM TRANSISTOR ARRAY PANEL

BACKGROUND OF THE INVENTION (a) Field of the Invention

The present invention relates to a thin film transistor array panel, and in particular, to a thin film transistor array panel used as a panel for a liquid crystal display.

(b) Description of the Related Art

A typical liquid crystal display ("LCD"), which is one of widely used flat panel displays, includes two panels having a plurality of electrodes generating electric field, a liquid crystal layer interposed therebetween, and two polarizers attached to outer surfaces of the panels for polarizing light The LCD applies voltages to the electrodes to reorient liquid crystal molecules in the liquid crystal layer, thereby adjusting the amount of light passing therethrough. The LCD uses one of the characteristics that voltage application varies orientations of the liquid crystal molecules, and the LCD employing transmittance or reflection of light requires an internal or external light source since the liquid crystal is not self-emissive.

A thin film transistor array ("TFT") panel for an LCD is used as a circuit board for driving pixels in an independent manner. The TFT array panel includes a scanning signal wire or a gate wire for transmitting scanning signals, an image signal wire or a data wire for transmitting image signals, a plurality of TFTs connected to the gate and the data wire, and a plurality of pixel electrodes connected to the wires through the TFTs for displaying images.

The pixel electrodes are designed to overlap the gate wire and the data wire for securing aperture ratio of the pixels, and a thick insulating layer having a low dielectric constant is provided between the pixel electrodes and the gate wire and the data wire in order to minimize parasitic capacitance generated therebetween.

However, there is a problem that undesired inversion of the arrangement of the liquid crystal molecules occurs around contact holes of an insulating layer for connecting the pixel electrodes and the data wire, and this causes light leakage to show disclination, thereby degrading display quality. The reason is that the direction of the electric field generated by the pixel electrodes formed along slopes of the insulating layer is opposite the orientations of the liquid crystal molecules, and thus the arrangement of the liquid crystal molecules is broken. Although the light leakage is blocked by designing opaque films such as the gate wire and the data wire to be wide, this reduces the aperture ratio, particularly for a high-resolution LCD.

SUMMARY OF THE INVENTION

A motivation of the present invention is to provide a thin film transistor array panel for a liquid crystal display capable of securing aperture ratio as well as minimizing light leakage.

In a thin film transistor array panel for an LCD according to an embodiment of the present invention, distances between boundaries of a contact hole at a contact portion, where alignment treatment or rubbing ends, and boundaries of a wire adjacent thereto is wider than distances between the boundaries thereof at the other portion.

In detail, an opaque film is formed on an insulating substrate and covered with an insulating layer having a contact hole, which expose the opaque film at least in part at a contact portion and having a plurality of boundaries, at least a portion of the boundaries located inside boundaries of the opaque film. A conductive layer is formed on the insulating layer and connected to the opaque film through the contact hole. A distance between one of the boundaries of the contact hole of the contact portion at a place where alignment treatment or rubbing ends and one of the boundaries of the opaque film located outside the contact hole is wider than a distance between the boundaries of the contact holes at other places and the boundaries of the opaque film.

The opaque film may include a first wire and a second wire insulated from and overlapping the first wire and the second wire is exposed through the contact hole. One of the boundaries of the first wire and the second wire is preferably located outside the boundaries of the contact hole at the place where alignment treatment or rubbing ends.

The first wire may be either a gate wire or a storage capacitor wire, the second wire may be either a data wire or a storage capacitor conductor, and the conductive layer may be a pixel electrode preferably made of transparent conductive material.

The gate wire preferably includes a gate line and a gate electrode connected to the gate line, and the data wire preferably includes a data line intersecting the gate line, a source electrode connected to the data line and placed close to the gate electrode, and a drain electrode opposite the source electrode with respect to the gate electrode.

The thin film transistor array panel according to the present invention may further include a gate insulating layer covering the gate wire, and a semiconductor layer formed on the gate insulating layer between the gate electrode and the source electrode and the drain electrode. The semiconductor layer may have the same shape as the data wire except for a channel portion between the source electrode and the drain electrode.

The storage capacitor wire may include a storage capacitor line separated from the gate wire and a storage capacitor electrode connected to the storage capacitor line and the storage capacitor conductor may be connected to the data wire.

The insulating film is preferably made of silicon nitride, organic insulating material or a low dielectric CVD film.

BRIEF DESCRIPTION OF THE DRAWINGS

FIGS. 11B and 11C are sectional views of the TFT array panel shown in FIG. 11A taken along the line XIB–XIB' and the line XIC–XIC', respectively;

FIGS. 17B and 17C are sectional view of the TFT array panel shown in FIG. 17A taken along the line XVIIB–XVIIB' and the line XVIIC–XVIIC', respectively;

DETAILED DESCRIPTION OF PREFERRED EMBODIMENTS

Figure 1A:
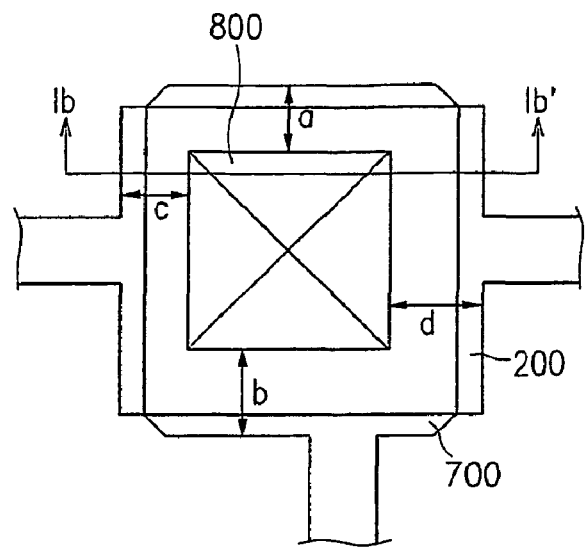
FIG. 1A is a layout view of a contact portion of a wire for an LCD according to an experimental example of the present invention.

The present invention now will be described more fully hereinafter with reference to the accompanying drawings, in which preferred embodiments of the present invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, film, region, substrate or panel is referred to as being "on" another element, it can be directly on the other element or intervening elements may also be present. In contrast, when an element is referred to as being "directly on" another element, there are no intervening elements present. Then, liquid crystal displays according to embodiments of the present invention will be described with reference to the drawings.

Now, a TFT array panel for an LCD according to embodiments of the present invention is described in detail with reference to the drawings.

Figure 1B:
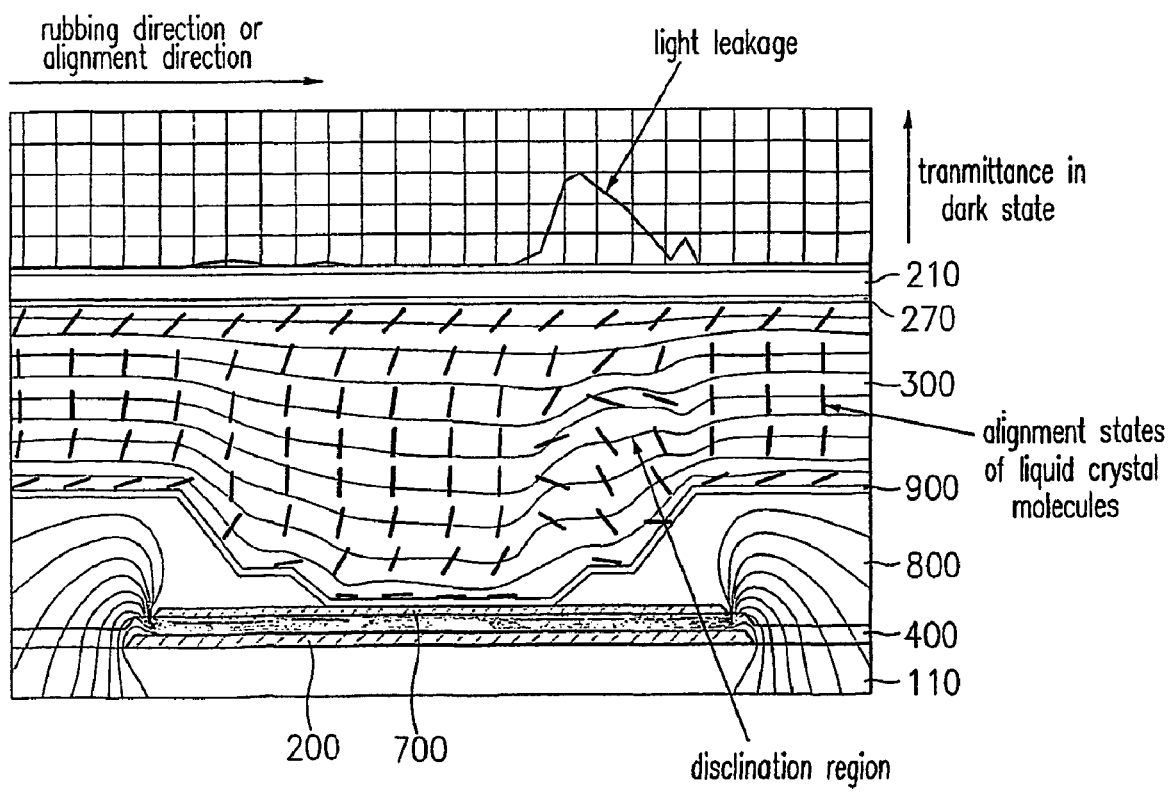
FIG. 1B illustrates a section of the contact portion shown in FIG. 1A taken along the line IB–IB' and a graph showing light leakage in a dark state.

FIG. 1A is a layout view of a contact portion of a wire for an LCD according to an experimental example of the present invention, and FIG. 1B illustrates a section of the contact portion shown in FIG. 1A taken along the line IB–IB' and a graph showing light leakage in a dark state. The experimental example designed an LCD and measured light leakage in a dark state under the same condition as an LCD manufactured by a practical process. In this case, liquid crystal molecules interposed between two panels are arranged in twisted nematic (TN) mode that the orientations of long axes of the liquid crystal molecules are aligned parallel to the two panels and are helically twisted from one panel to the other panel in absence of electric field.

As shown in FIGS. 1A and 1B, a TFT array panel for an LCD according to an embodiment of the present invention includes a first opaque wire 200 formed on a lower insulating substrate 110, a second opaque wire 700 overlapping the first wire 200 via a first insulating layer 400, and a first conductive layer 900 formed on a second insulating layer 800 on the second wire 700 and connected to the second wire 700 through a contact hole of the second insulating layer 800.

A color filter array panel facing the TFT array panel in parallel includes a second conductive layer 270 formed on an upper insulating layer 210 and facing the first conductive layer 900 to generate electric field for rearranging or driving liquid crystal molecules.

As shown FIG. 1B, the liquid crystal molecules in a liquid crystal layer 300 interposed between the substrates 110 and 210 are aligned upon application of electric field with sufficient strength to the liquid crystal layer 300 generated by the provision of voltages for the conductive layers 900 and 270, such that the long axes of the liquid crystal molecules of the liquid crystal layer 300 are parallel to the field direction and thus perpendicular to the substrates 110 and 210. The aligning force of alignment films (not shown) alignment-treated or rubbed for initially aligning the liquid crystal molecules with a predetermined direction enforces the liquid crystal molecules adjacent to the substrates 110 and 210 to make an angle with the substrates 110 and 210.

However, the arrangement of the liquid crystal molecules is broken at a place, where alignment-treatment or rubbing ends, of a contact portion where the first conductive layer 700 is connected to the second conductive layer 900 through the contact hole of the second insulating layer 800, and this increases light-leakage. The disorder of the molecular arrangement is resulted from an electric field induced from an inclined surface of the first conductive layer 900 on the second insulating layer 800 opposite to the orientations of the liquid crystal molecules. In the present invention, the first wire 200 or the second wire 700 is formed to block disclination areas in order to prevent light leakage at the contact portion. In order that the first and the second wires 200 and 700 are optimally designed to secure the aperture ratio of the pixels, the disclination areas are preferably covered with the first and the second wires 200 and 700 with minimum areas. For this purpose, among distances a, b, c and d between edges of the contact hole and edges of the first wire 200 and the second wire 700 adjacent thereto and positioned outside edges of the contact hole, the distances b and d near the place where alignment treatment or rubbing ends are designed to be wider than the distances a and c near the other place. In this way, the first and the second wires 200 and 700 can be designed to have minimum areas for securing the aperture ratio of the pixels, and, at the same time, block light leakage can be blocked with the first and the second wires 200 and 700. Although the boundaries of both the first and the second wires 200 and 700 are positioned outside the boundaries of the contact hole as shown in FIG. 1A, only one of two boundaries may be positioned at outside thereof. However, at least one of the boundaries of the first and the second wires 200 and 700 near a part of the contact portion where alignment treatment or rubbing ends is preferably positioned at outside thereof.

In the LCD, the first wire 200 may be a gate line or a storage electrode used as one electrode of a storage capacitor and the second wire 700 may be a drain electrode or a storage capacitor conductor used as the other electrode of the storage capacitor. The first and the second conductive layers 900 and 210 may be a pixel electrode and a common electrode, respectively. Although FIG. 1A and FIG. 1B show the liquid crystal arrangement in a TN mode, the configuration of the contact portion according to the present invention is also applicable to an OCB (optically compensated bend) mode LCD where liquid crystal molecules having positive dielectric anisotropy are aligned symmetrical with respect to a mid-plane between two substrates and vary their alignment from a homogeneous (or horizontal) alignment to a homeotropic (vertical) alignment from surfaces of the panels to the mid-plane. In addition, the configuration of the contact portion according to the present invention is also applicable to a VA (vertically aligned) mode LCD where liquid crystal molecules having a negative dielectric anisotropy are initially arranged vertical to surfaces of two panels and vary their alignment from a homeotropic alignment to a homogeneous alignment from the surface of the panels to a mid-plane between the two panels.

Now, TFT array panels for an LCD having contact portions and manufacturing methods thereof according to embodiments of the present invention will be described in detail.

First, a TFT array panel for an LCD according to a first embodiment of the present invention will be described in detail with reference to FIGS. 2 and 3.

Figure 2:
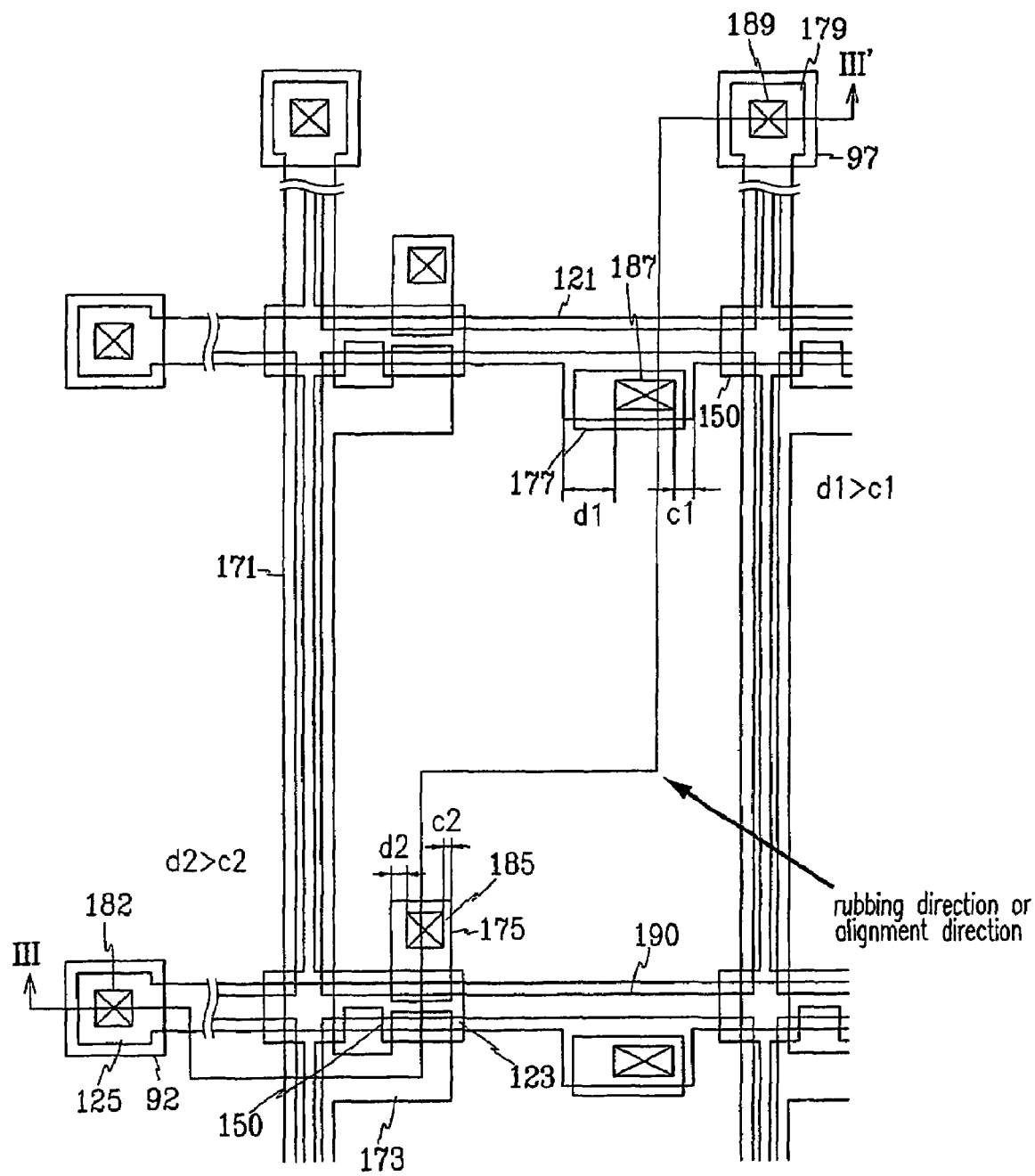
FIG. 2 is a layout view of a TFT array panel for an LCD according to a first embodiment of the present invention.
Figure 3:
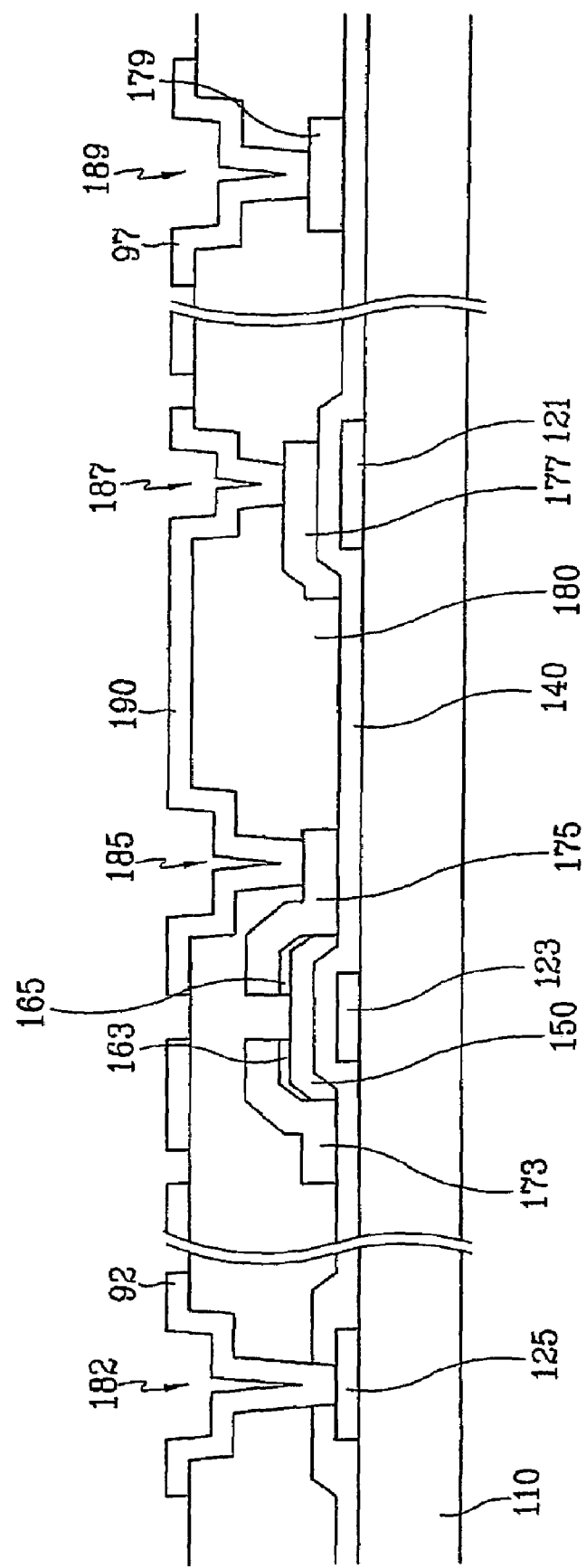
FIG. 3 is a sectional view of the TFT array panel shown in FIG. 1 taken along the line III–III'.

FIG. 2 is a layout view of a TFT array panel for an LCD according to a first embodiment of the present invention, and FIG. 3 is a sectional view of the TFT array panel shown in FIG. 2 taken along the line III–III'.

A gate wire preferably made of a single layer made of Ag, Ag alloy, Al or Al alloy having low resistivity, or multi-layers including the single layer is formed on an insulating substrate 110. The gate wire includes a plurality of gate lines 121 extending in a transverse direction, a plurality of gate pads 125 connected to one ends of the gate lines 121 and transmits gate signals from an external device to the gate lines 121, and a plurality of gate electrodes 123 of TFTs connected to the gate lines 121. The gate wire overlaps storage capacitor conductors 177 connected to pixel electrodes 82 to form storage capacitors for enhancing the charge storing capacity of pixels, which will be described later.

A gate insulating layer 140 preferably made of SiNx is formed on the substrate 110 and covers the gate wire 121, 123 and 125.

A semiconductor layer 150 preferably made of amorphous silicon is formed on the gate insulating layer 140 opposite the gate electrodes 125. An ohmic contact layer 163 and 165 preferably made of silicide or n+ hydrogenated amorphous silicon heavily doped with n type impurities is formed on the semiconductor layer 150.

A data wire is formed on the ohmic contact layer 163 and 165 or the gate insulating layer 140. The data wire includes a conductive layer preferably made of a conductive material with low resistivity such as Ag and Al. The data wire includes a plurality of data lines 171 extending in a longitudinal direction and intersecting the gate lines 121 to define a plurality of pixel areas, a plurality of source electrodes 173 connected to the data lines 171 and extending onto portions 163 of the ohmic contact layer, a plurality of data pads 179 connected to one ends of the data lines 171 and receiving image signals from an external device, and a plurality of drain electrodes 175 formed on the other portions 165 of the ohmic contact layer, located opposite the source electrodes 173 with respect to the gate electrodes 123, and separated from the source electrodes 173. The data wire includes a plurality of storage capacitor conductors 177 overlapping the gate lines 121 and connected to the pixel electrodes 190, which is formed later.

A passivation layer 180 is formed on the data wire 171, 173, 175, 177 and 179 and portions of the semiconductor layer 150, which are not covered with the data wire 171, 173, 175, 177 and 179. The passivation layer 180 includes an insulating layer preferably made of photosensitive organic material having an excellent smoothing characteristic or low dielectric insulating material such a-Si:C:O:H. The passivation layer 180 may further include an insulating layer made of SiNx, which is preferably disposed under the organic insulating layer to directly cover the semiconductor layer 150. In addition, the organic insulating material is preferably removed from pad portions where the gate pads 125 and the data pads 179 are provided, and this configuration is specifically advantageous to an LCD in COG (chip on glass) type, which directly mounts gate driving ICs and data driving ICs on a TFT array panel.

The passivation layer 180 is provided with a plurality of contact holes 185, 187 and 189 respectively exposing the drain electrodes 175, the storage capacitor conductors 177, and the data pads 179, and the passivation layer 180 and the gate insulating layer 140 have a plurality of contact holes 182 exposing the gate pads 125. As described above, in order that the drain electrodes 175, the storage capacitor conductors 177, and portions of the gate lines 121 overlapping them are optimally designed at the contact portions to secure the aperture ratio of the pixels, the disclination areas at the contact portions are covered with minimum areas thereof. For this purpose, among distances c1, c2, d1 and d2 between edges of the contact holes 185 and 187 and edges of the drain electrodes 175, the gate lines 121, and the storage capacitor conductors 177 adjacent thereto, the distances d1 and d2 near the places where alignment treatment or rubbing ends are wider than the distances c1 and c2 near the other places. In this way, the drain electrodes 175, the storage capacitor conductors 177, and portions of the gate lines 121 overlapping them can be designed to have minimum areas for securing the aperture ratio of the pixels, and block light leakage at the contact portions.

A plurality of pixel electrodes 190 located in the pixel areas are formed on the passivation layer 180. The pixel electrodes 190 are electrically connected to the drain electrodes 175 through the contact holes 185 and are preferably made of transparent conductive material such as indium zinc oxide (IZO) or indium tin oxide (ITO). Furthermore, a plurality of subsidiary gate pads 123 and a plurality of subsidiary data pads 179 are formed on the passivation layer 180. The subsidiary gate pads 123 and the subsidiary data pads 179 are connected to the gate pads 125 and the data pads 179 through the contact holes 182 and 189, respectively. The subsidiary gate pads 92 and the subsidiary data pads 97 are used to protect the gate pads 125 and the data pads 179, but are not requisites.

A method of manufacturing a TFT array panel will be now described in detail with reference to FIGS. 4A to 7B as well as FIGS. 2 and 3.

Figure 4A:
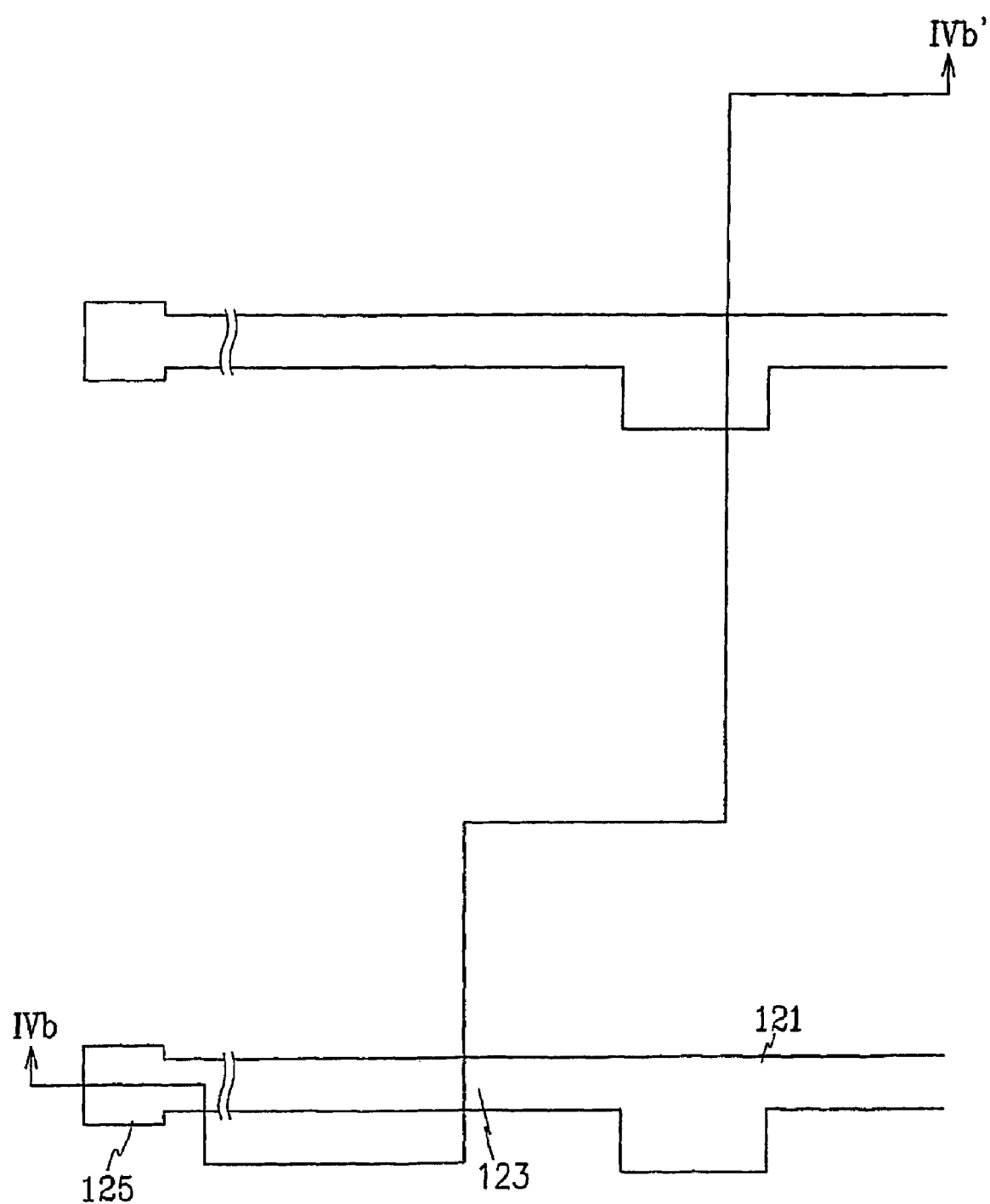
FIGS. 4A, 5A, 6A and 7A are layout views of a TFT array panel for an LCD sequentially illustrating the intermediate steps of a manufacturing method thereof according to an embodiment of the present invention.
Figure 4B:
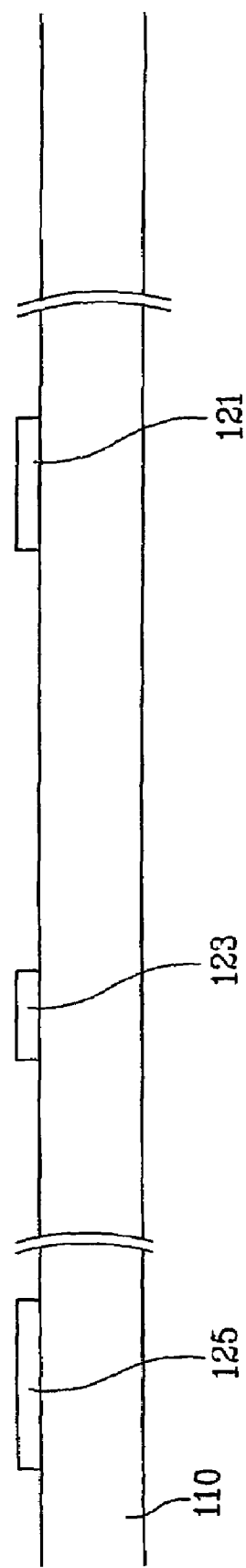
FIG. 4B is a sectional view of the TFT array panel shown in FIG. 4A taken along the line IVB–IVB'.

First, as shown in FIGS. 4A and 4B, a single layer preferably made of low resistivity conductive material such as Al or Al alloy or multi layers including the single layer are deposited on a glass substrate 110 and photo-etched using a mask to form a gate wire including a plurality of gate lines 121, a plurality of gate electrodes 123, and a plurality of gate pads 125.

Figure 5A:
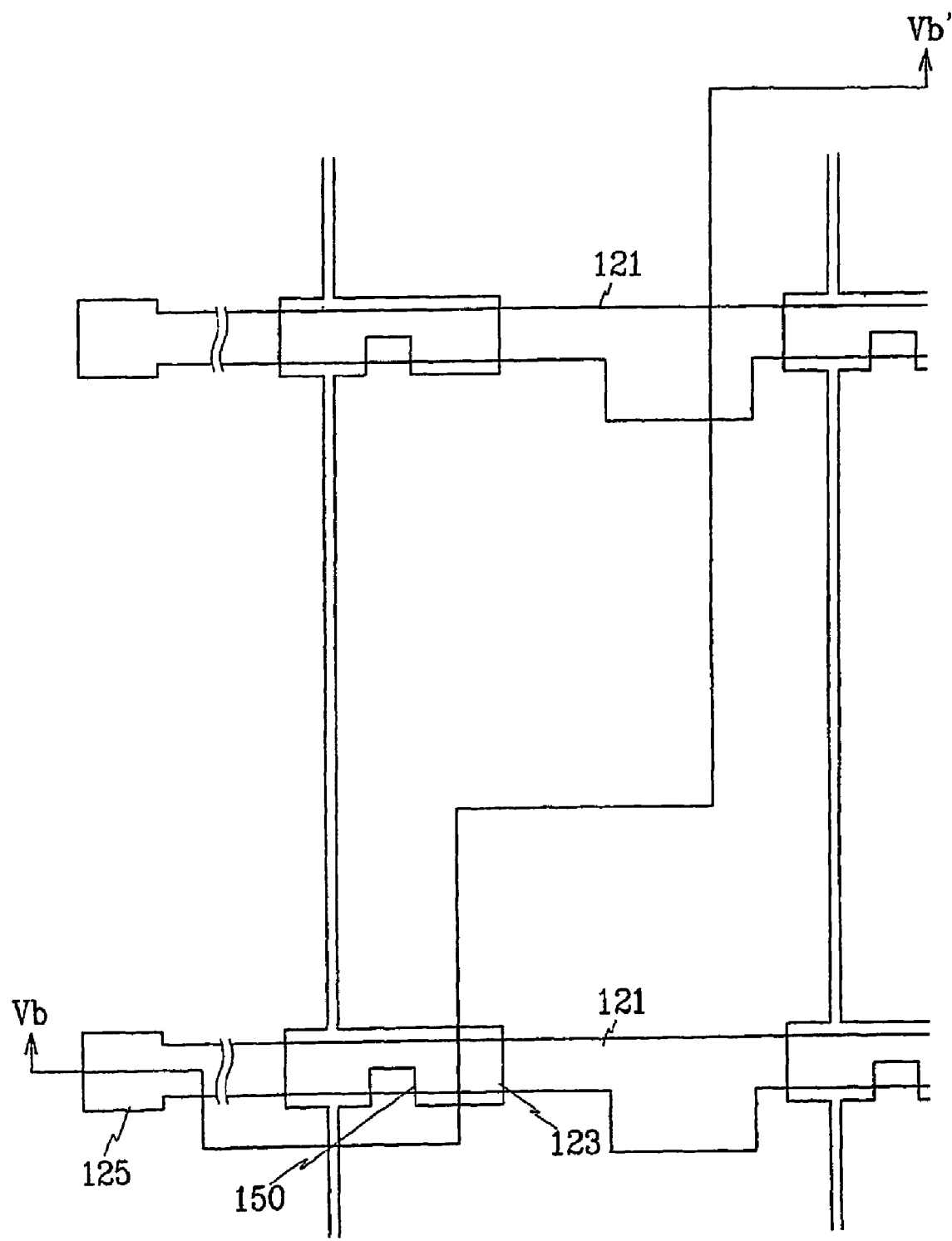
Figure 5B:
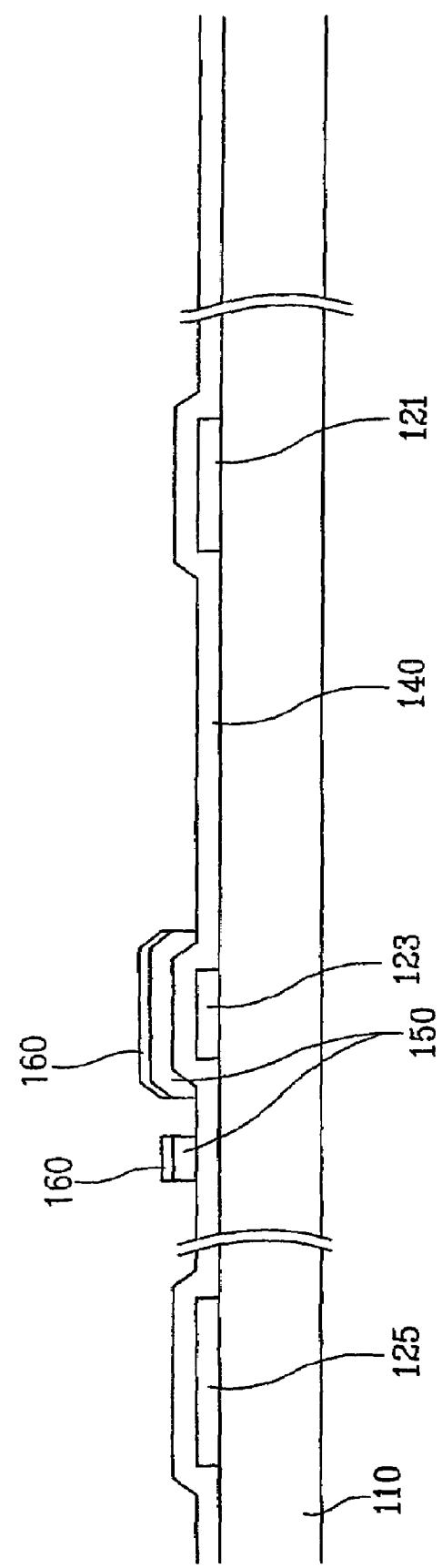
FIG. 5B is a sectional view of the TFT array panel shown in FIG. 5A taken along the line VB–VB' in the step following the step shown in FIG. 4B.

As shown in FIGS. 5A and 5B, triple layers including a gate insulating layer 140 preferably made of silicon nitride, a semiconductor layer 150 preferably made of amorphous silicon, and a doped amorphous silicon layer are sequentially deposited thereon. The doped amorphous silicon layer and the semiconductor layer are photo-etched using a mask to form a semiconductor layer 150 and an ohmic contact layer 160 on the gate insulating layer 140 opposite the gate electrodes 125.

Figure 6A:
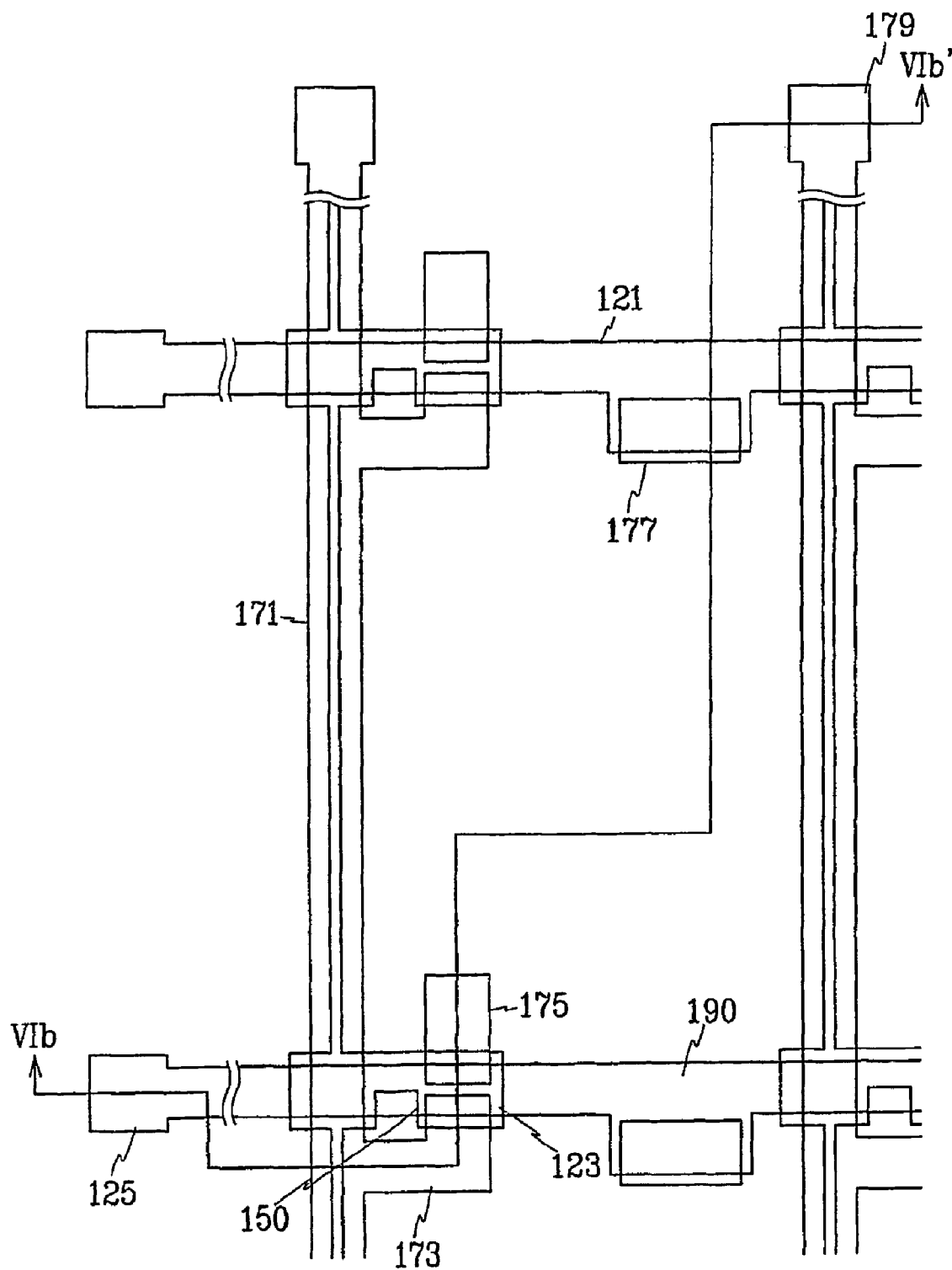
Figure 6B:
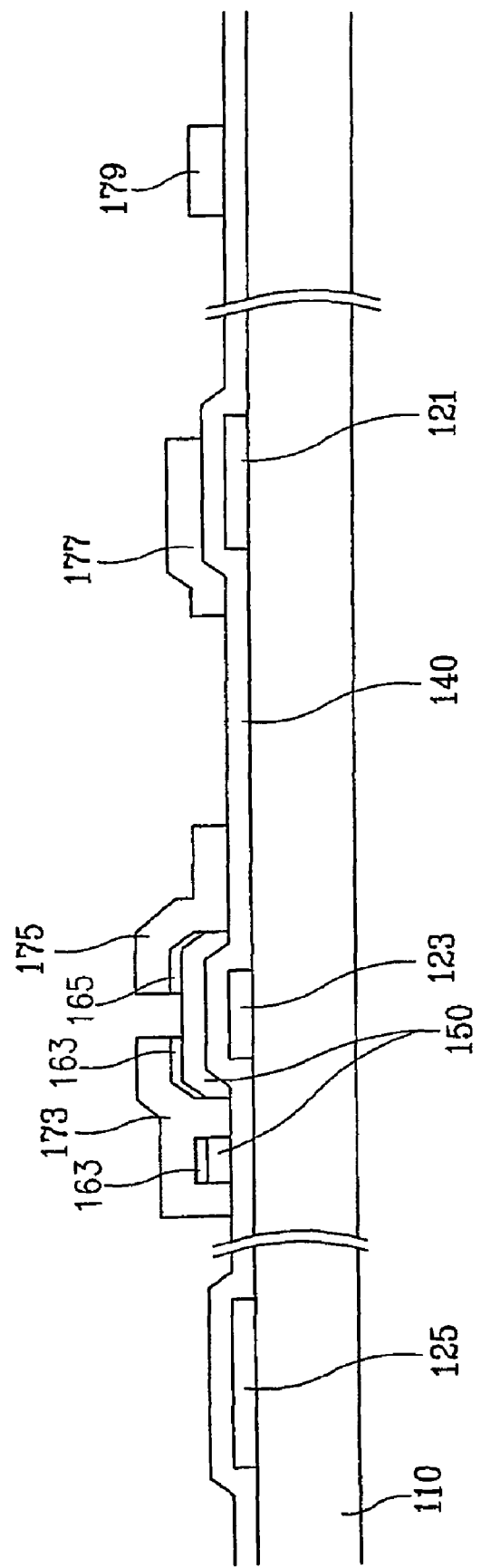
FIG. 6B is a sectional view of the TFT array panel shown in FIG. 6A taken along the line VIB–VIB' in the step following the step shown in FIG. 5B.

Thereafter, as shown in FIGS. 6A and 6B, a conductive layer for a data wire made of conductive material having low resistivity is deposited and photo-etched using a mask to form a data wire. The data wire includes a plurality of data lines 171 intersecting the gate lines 121, a plurality of source electrodes 173 connected to the data lines 171 and extending onto the gate electrodes 123, a plurality of data pads 179 connected to one ends of the data lines 171, a plurality of drain electrodes 175 separated from the source electrodes 173 and opposite the source electrodes 173 with respect to the gate electrodes 123, and the storage capacitor conductors 177.

Then, portions of the doped amorphous silicon layer pattern 160, which are not covered by the data wire 171, 173, 175, 177 and 179, are removed such that the doped amorphous silicon layer including a plurality of pairs of two separated portions 163 and 165 with respect to the gate electrodes 123 are formed and portions of the semiconductor layer 150 between the separated portions 163 and 165 of the doped amorphous silicon layer are exposed. In order to stabilize the exposed surface of the semiconductor layer 150, oxygen plasma treatment preferably follows.

Figure 7A:
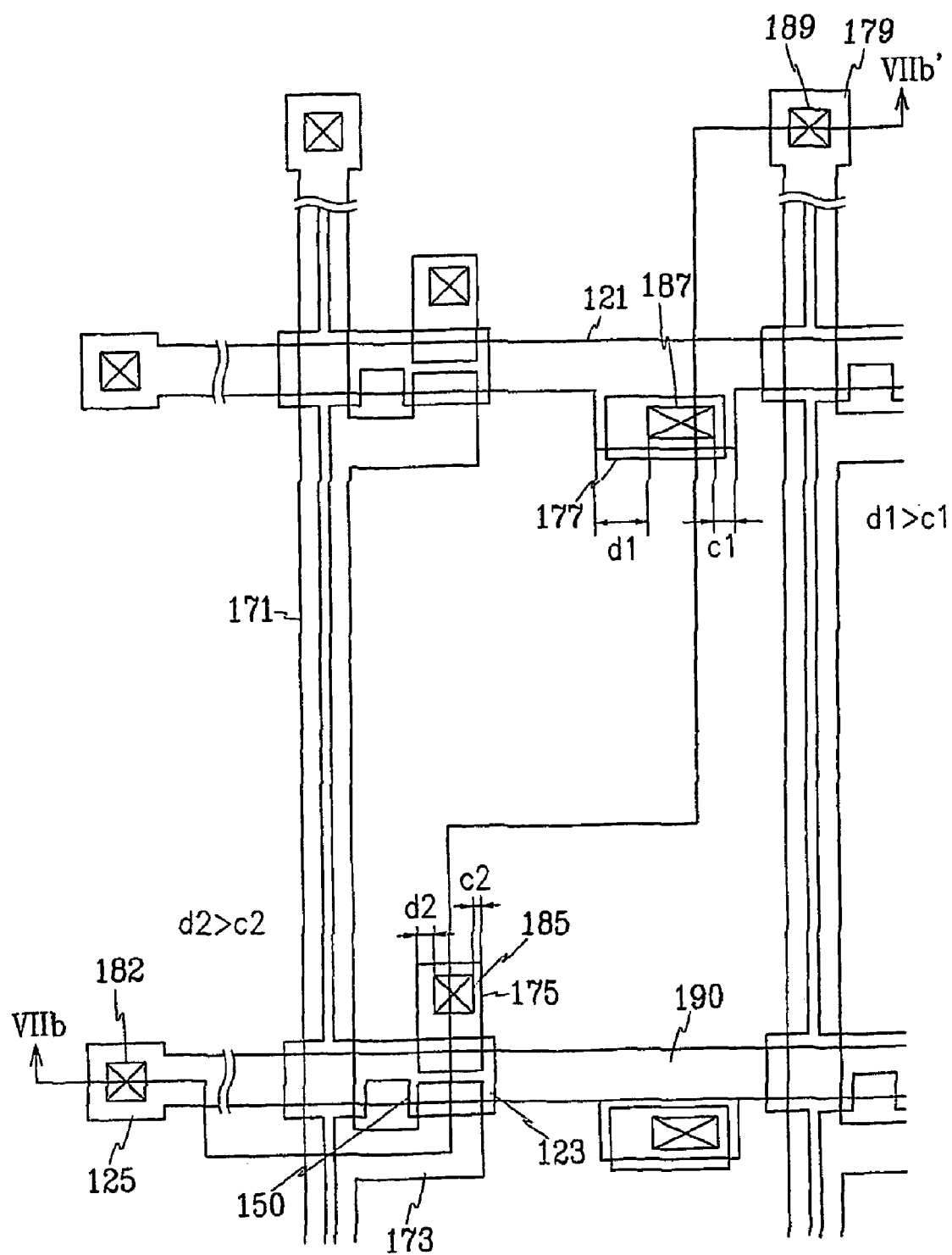
Figure 7B:
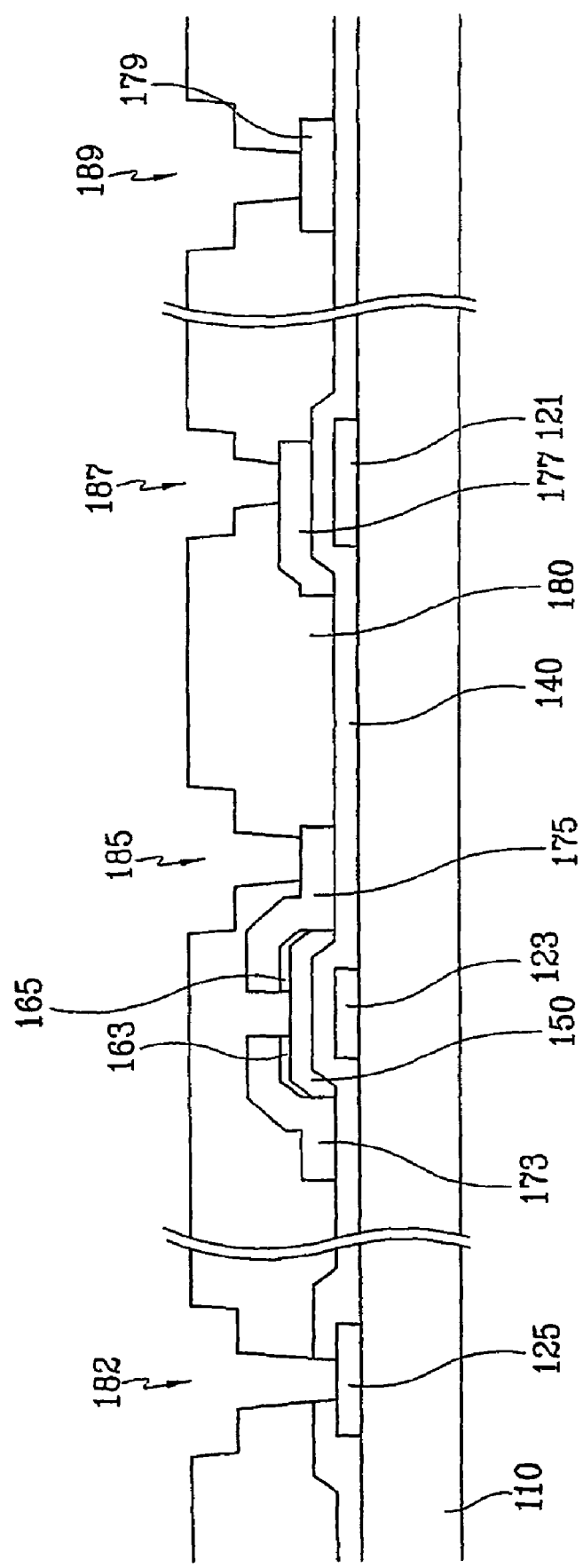
FIG. 7B is a sectional view of the TFT array panel shown in FIG. 7A taken along the line VIIB–VIIB' in the step following the step shown in FIG. 6B.

As shown in FIGS. 7A and 7B, a passivation layer 180 is formed by depositing silicon nitride, by coating a photosensitive organic insulating material having good flatness characteristic, or by depositing a low dielectric CVD film such as a-Si:C:O and a-Si:O:F using plasma enhance chemical vapor deposition (PECTD). The protective layer 180 together with the gate insulating layer 140 is photo-etched using a mask to form a plurality of contact holes 182, 185, 187 and 189 exposing the gate pads 125, the drain electrodes 175, the storage capacitor conductors 177, and the data pads 179, respectively.

Finally, as shown in FIGS. 2 and 3, an ITO layer or an IZO layer is deposited and photo-etched using a mask to form a plurality of pixel electrodes 190, a plurality of subsidiary gate pads 92, and a plurality of subsidiary data pads 97. The pixel electrodes 190 are connected to the drain electrodes 175 and the storage capacitor conductors 177 through the contact holes 185 and 187, respectively. The subsidiary gate pads 92 and the subsidiary data pads 97 are connected to the gate pads 125 and the data pads 179 through the contact holes 182 and 189, respectively.

Although the embodiment of the present invention is applied to the manufacturing method forming a semiconductor layer and a data wire by photo etching using separate masks, the method of manufacturing a wire according to the present invention is also applicable to a manufacturing method of a TFT array panel for an LCD forming the semiconductor layer and the data wire by photo etching using a single photoresist pattern. It is described in detail with reference to the drawings.

Figure 8:
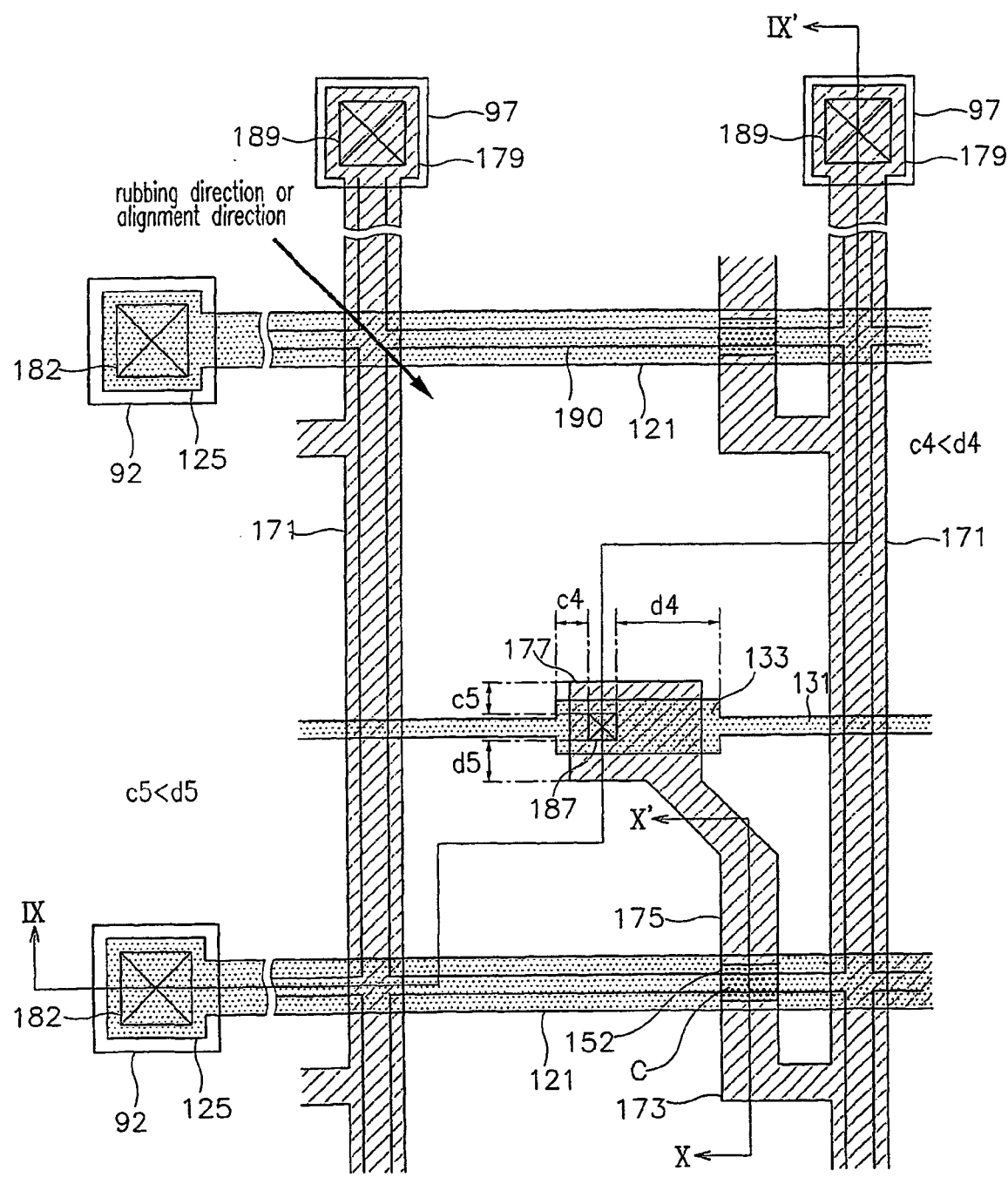
FIG. 8 is a layout view of a TFT array panel for an LCD according to a second embodiment of the present invention.
Figure 9:
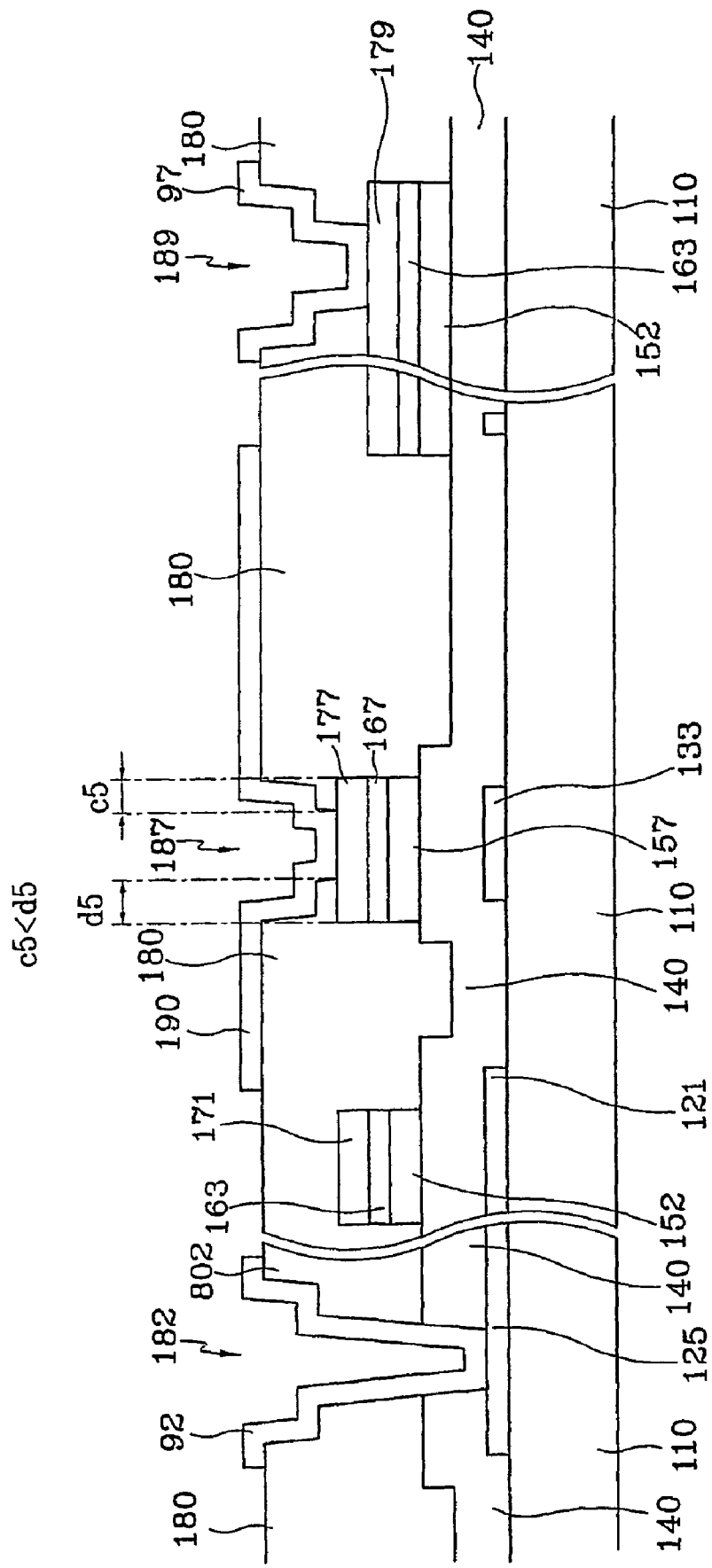
FIGS. 9 and 10 are sectional views of the TFT array panel shown in FIG. 8 taken along the line IX–IX' and the line X–X', respectively.
Figure 10:
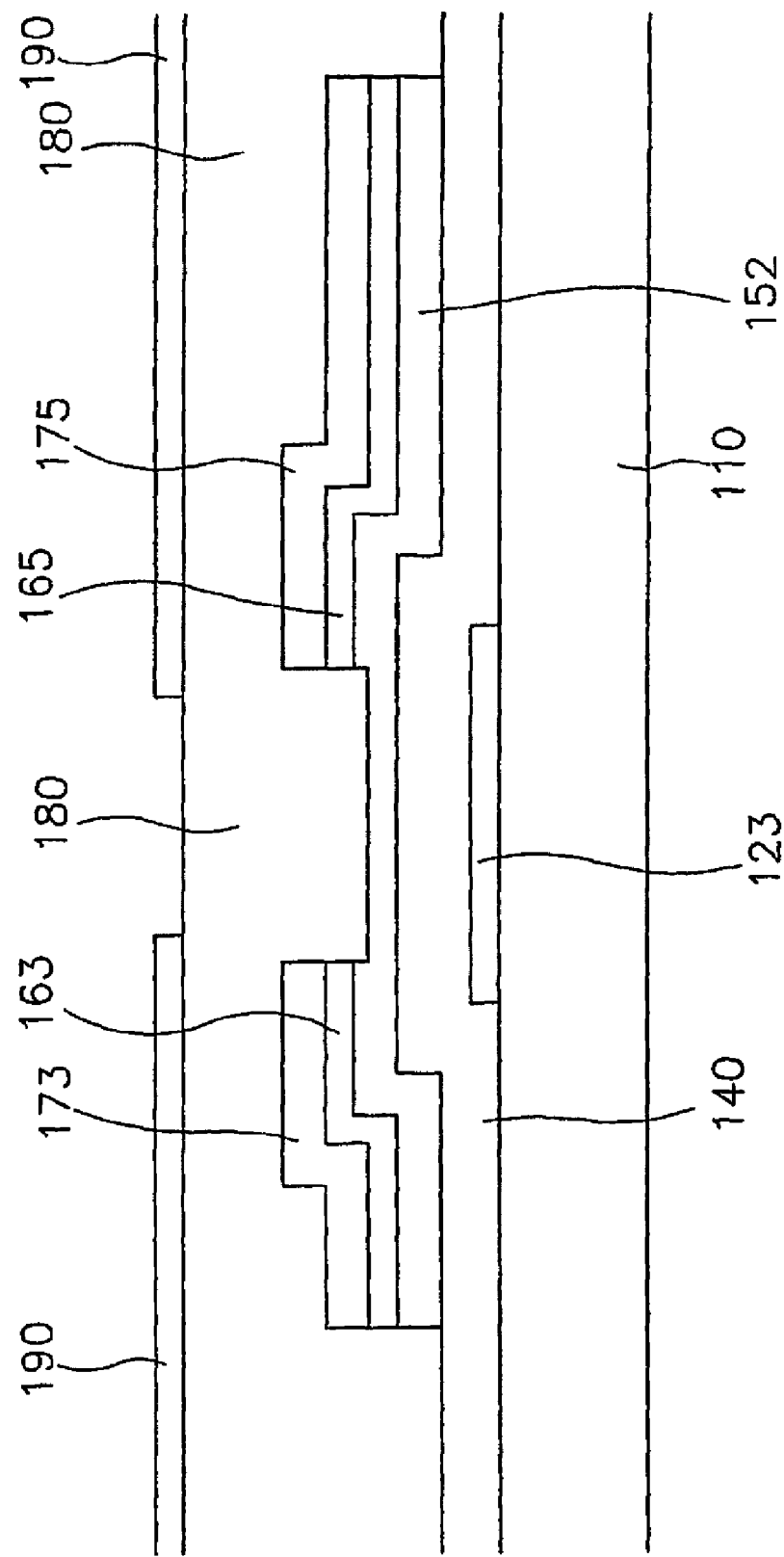

First, a pixel unit of a TFT array panel for an LCD according to a second embodiment of the present invention with reference to FIGS. 8–10.

FIG. 8 is a layout view of a TFT array panel for an LCD according to a second embodiment of the present invention, and FIGS. 9 and 10 are sectional views of the TFT array panel shown FIG. 7 taken along the line IX–IX' and the line X–X', respectively.

A gate wire is formed on an insulating substrate 110. The gate wire includes a single layer or multi layers made of conductive material having low resistivity such as Ag, Ag alloy, Al, Al alloy, Cr or Ta. The gate wire includes a plurality of gate lines 121, a plurality of gate pads 125, and a plurality of gate electrodes 123. A storage capacitor wire is also formed on the substrate 110. The storage capacitor wire includes a plurality of storage capacitor lines 131 parallel to the gate lines 121 and supplied with an external voltage such as a common voltage to be applied to a common electrode of an upper panel and a plurality of storage electrodes 133 connected thereto. The storage electrodes 133 overlap storage capacitor conductors 177 connected to pixel electrodes 190 to form storage capacitors for enhancing the charge storing capacity of pixels, which will be described later. In case the overlapping of the pixel electrodes 190 and the gate lines 121 gives sufficient storage capacitance, the storage capacitor wire may be omitted.

A gate insulating layer 140 preferably made of SiNx is formed on the gate wire 121, 123 and 125 and the storage capacitor wire 131 and 133 to cover the gate wire 121, 123 and 125 and the storage capacitor wire 131 and 133.

A semiconductor pattern 152 and 157 preferably made of polysilicon or amorphous silicon is formed on the gate insulating layer 140. An ohmic contact pattern (or an intermediate layer pattern) 163, 165 and 167 preferably made of amorphous silicon heavily doped with n type impurities such as phosphorous P or p type impurities is formed on the semiconductor pattern 152 and 157.

A data wire preferably made of conductive material having a low resistivity like the first embodiment is formed on the ohmic contact pattern 163, 165 and 167. The data wire includes a plurality of data line units 171, 173 and 179, a plurality of drain electrodes 175 of TFTs, and a plurality of storage capacitor conductors 177. Each data line unit includes a data line 171 extending in a longitudinal direction, a data pad 179 connected to one end of the data line 171 and receiving image signals from an external device, and a plurality of source electrodes 173 of TFTs branched from the data line 171. Each drain electrode 175 is separated from the data line units 171, 173 and 179 and placed opposite to the corresponding source electrode 173 with respect to the corresponding gate electrode 123 or the channel portion C of the TFT. The storage capacitor conductors 177 are placed over the storage capacitor wire 131 and 133. In the absence of the storage capacitor wire 131 and 133, the storage capacitor conductors 177 are also omitted. Although the storage capacitor conductors 177 are connected to the drain electrodes 175, they may not so.

The data wire 171, 173, 175, 177 and 179 may include a conductive layer preferably made of Ag, Ag alloy, Al, Al alloy, Cr, Mo, Mo alloy, Ta, or Ti.

The ohmic contact pattern 163, 165 and 167 reduces the contact resistance between the underlying semiconductor pattern 152 and 157 and the overlying data wire 171, 173, 175, 177 and 179 and has substantially the same shape as the data wire 171, 173, 175, 177 and 179. That is, the ohmic contact pattern 163, 165 and 167 includes a plurality of data-line ohmic contacts 163 having substantially the same shapes as the data line units 171, 173 and 179, a plurality of drain-electrode ohmic contacts 163 having substantially the same shapes as the drain electrodes 173, and a plurality of storage-capacitor ohmic contacts 167 having substantially the same shapes as the storage capacitor conductors 177.

Meanwhile, the semiconductor pattern 152 and 157 has substantially the same shape as the data wire 171, 173, 175, 177 and 179 and the ohmic contact pattern 163, 165 and 167 except for the TFT channel areas C. Specifically, the semiconductor pattern 152 and 157 includes a plurality of storage-capacitor semiconductors 157 having substantially the same shapes as the storage capacitor conductors 177 and the storage-capacitor ohmic contacts 167 and a plurality of TFT semiconductors 152 having a little different shapes from the remains of the data wire and the ohmic contact pattern. That is, the data line units 171, 173 and 175, in particular the source electrode 173 and the drain electrode 175 are separated from each other at the TFT channel areas C, where the data-line ohmic contacts 163 and the drain-electrode ohmic contacts 165 are also separated from each other. However, the TFT semiconductors 152 continue to proceed there without disconnection to form TFT channels.

A passivation layer 180 is formed on the data wire 171, 173, 175, 177 and 179 and the semiconductors 152, which are not covered with the data wire 171, 173, 175, 177 and 179. The passivation layer 180 preferably includes an insulating layer such as SiNx or SiOx, an organic insulating layer preferably of organic material having a low dielectric constant, or a low dielectric CVD layer.

The passivation layer 180 has a plurality of contact holes 185, 187 and 189 exposing the drain electrodes 175, the storage capacitor conductors 177, and the data pads 179. The passivation layer 180 together with the gate insulating layer 140 is further provided with a plurality of contact holes 182 exposing the gate pads 125. Like the first embodiment, in order that the drain electrodes 175, the storage capacitor conductors 177, and portions of the storage electrodes 133 overlapping them are optimally designed at the contact portions to secure the aperture ratio of the pixels, the disclination areas at the contact portions are covered with minimum areas thereof. For this purpose, among distances c3, c4, c5, d3, d4 and d5 between edges of the contact holes 185 and 187 and edges of the drain electrodes 175, the storage electrodes 133, and the storage capacitor conductors 177, the distances d3, d4 and d5 near the places where alignment treatment or rubbing ends are wider than the distances c3, c4 and c5 near the other places. In this way, the drain electrodes 175, the storage capacitor conductors 177, and portions of the storage electrodes 133 overlapping them can be designed to have minimum areas for securing the aperture ratio of the pixels, and block light leakage at the contact portions.

A plurality of pixel electrodes 190 receiving image signals from the TFTs and generating electric fields in cooperation with an electrode of an upper panel are formed on the passivation layer 180. The pixel electrodes 190 are made of a transparent conductive material such as ITO and IZO. The pixel electrodes 190 are physically and electrically connected to the drain electrodes 175 through the contact holes 185 to receive the image signals. The pixel electrodes 190 overlap the neighboring gate lines 121 and the adjacent data lines 171 to enlarge the aperture ratio, but the overlapping may be omitted. The pixel electrodes 190 are also connected to the storage capacitor conductors 177 through the contact holes 187 and transmit the image signals to the conductors 177.

Meanwhile, a plurality of subsidiary gate pads 92 and a plurality of subsidiary data pads 97 are formed on the gate pads 125 and the data pads 179 to be connected thereto through the contact holes 182 and 189, respectively. The subsidiary gate pads 92 and the subsidiary data pads 97 compensate the adhesiveness of the pads 125 and 179 to external circuit devices and protect the pads 125 and 179. The subsidiary gate pads 92 and the subsidiary data pads 97 are not requisites but may be introduced in a selective manner.

A method of manufacturing the TFT array panel for an LCD shown in FIG. 8–10 will be now described in detail with reference to FIGS. 11A to 17C as well as FIGS. 8 and 10.

Figure 11A:
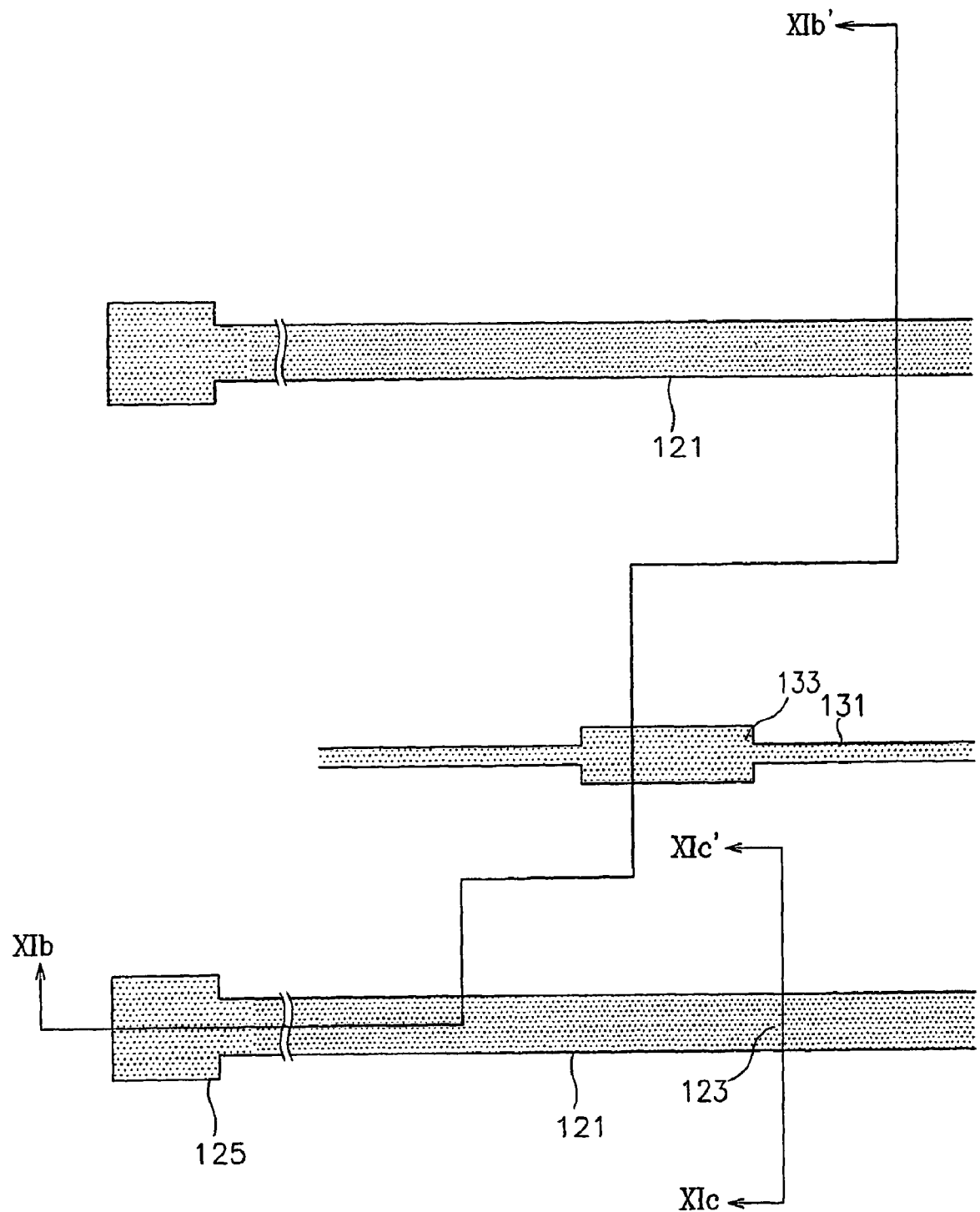
FIG. 11A is a layout view of the TFT array panel shown in FIG. 8 in the first step of a manufacturing method according to the second embodiment of the present invention.
Figure 11B:
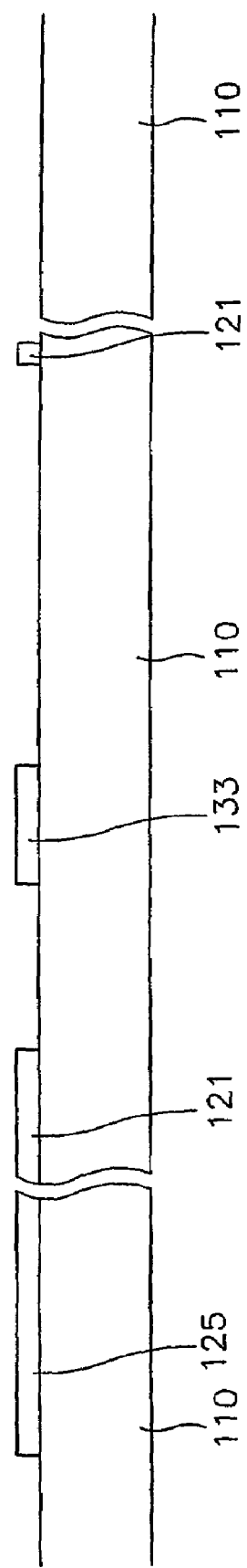

First, as shown in FIGS. 11A to 11C, a conductive layer including Ag, Ag alloy, Al or Alloy is deposited on a substrate 110, and photo-etched using a mask to form a gate wire and a storage capacitor wire. The gate wire 121, 125 and 123 includes a plurality of gate lines 121, a plurality of gate electrodes 123, and a plurality of gate pads 125, and the storage capacitor wire includes a plurality of storage capacitor lines 131 and a plurality of storage electrodes 133.

Figure 12A:
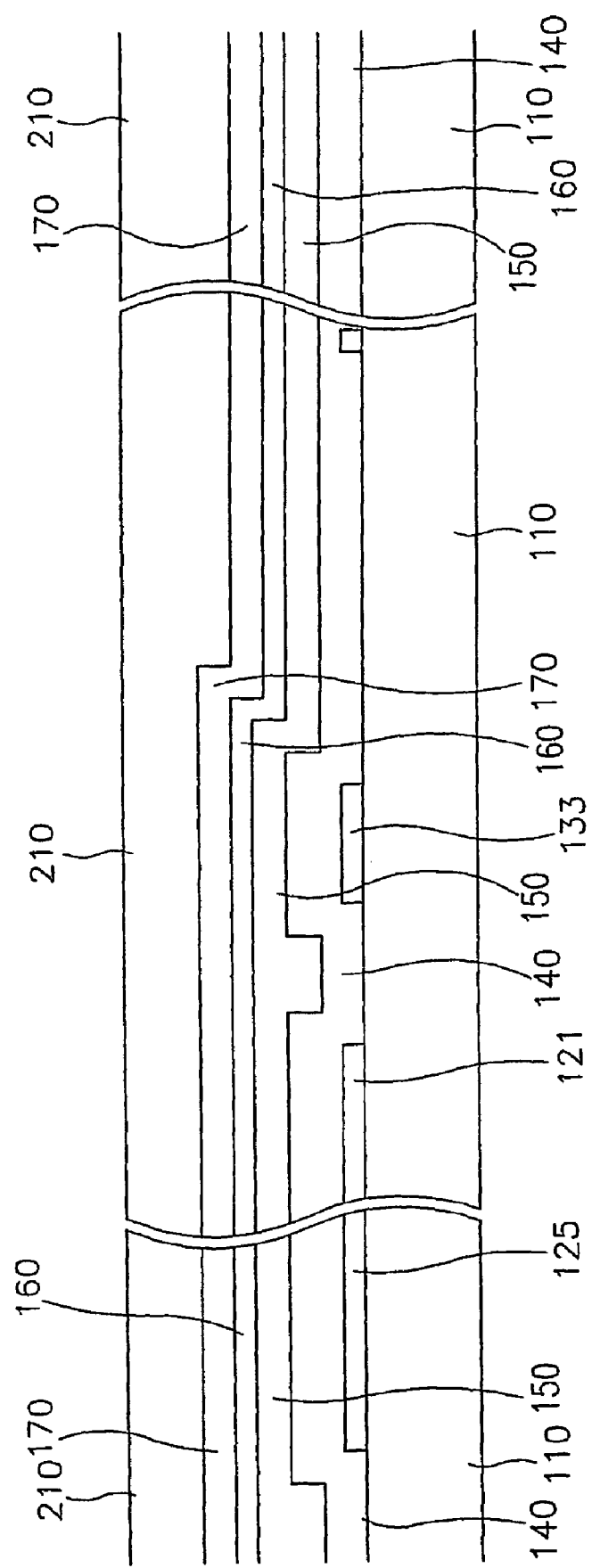
FIGS. 12A and 12B are sectional views of the TFT array panel shown in FIG. 11A taken along the line XIB–XIB' and the line XIC–XIC', respectively, in the step following the step illustrated in FIGS. 11B and 11C.
Figure 12B:
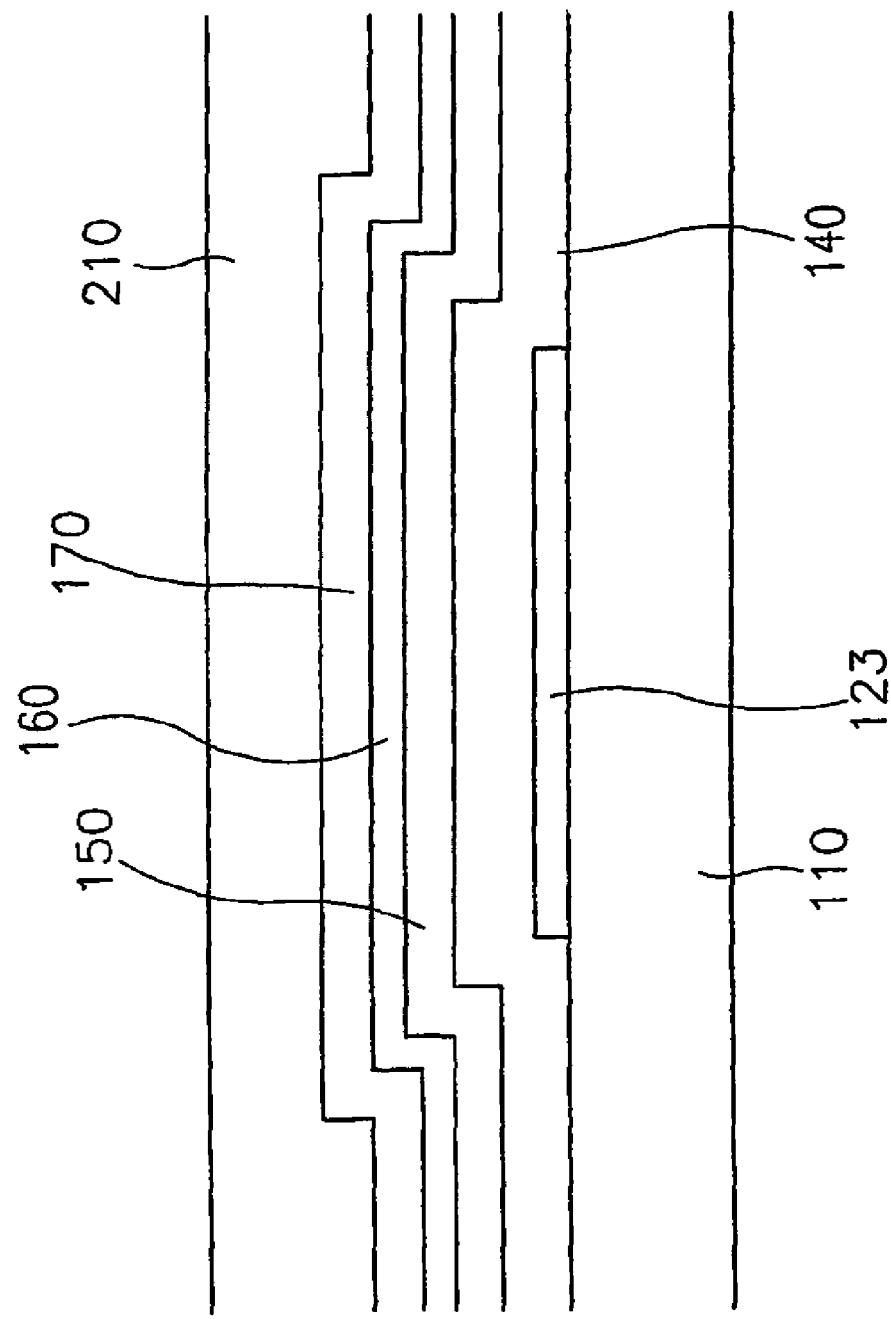

As shown in FIGS. 12A and 12B, a silicon nitride gate insulating layer 140 with 1,500–5,000 Å thickness, a semiconductor layer 150 of intrinsic amorphous silicon with 500–2,000 Å thickness, and an intermediate layer 160 of extrinsic amorphous silicon with 300–600 Å thickness are sequentially deposited on the substrate 110 by CVD. A conductive layer 170 is formed on the intermediate layer 160, and a photoresist film 210 with thickness of 1–2 microns is coated thereon.

Figure 13A:
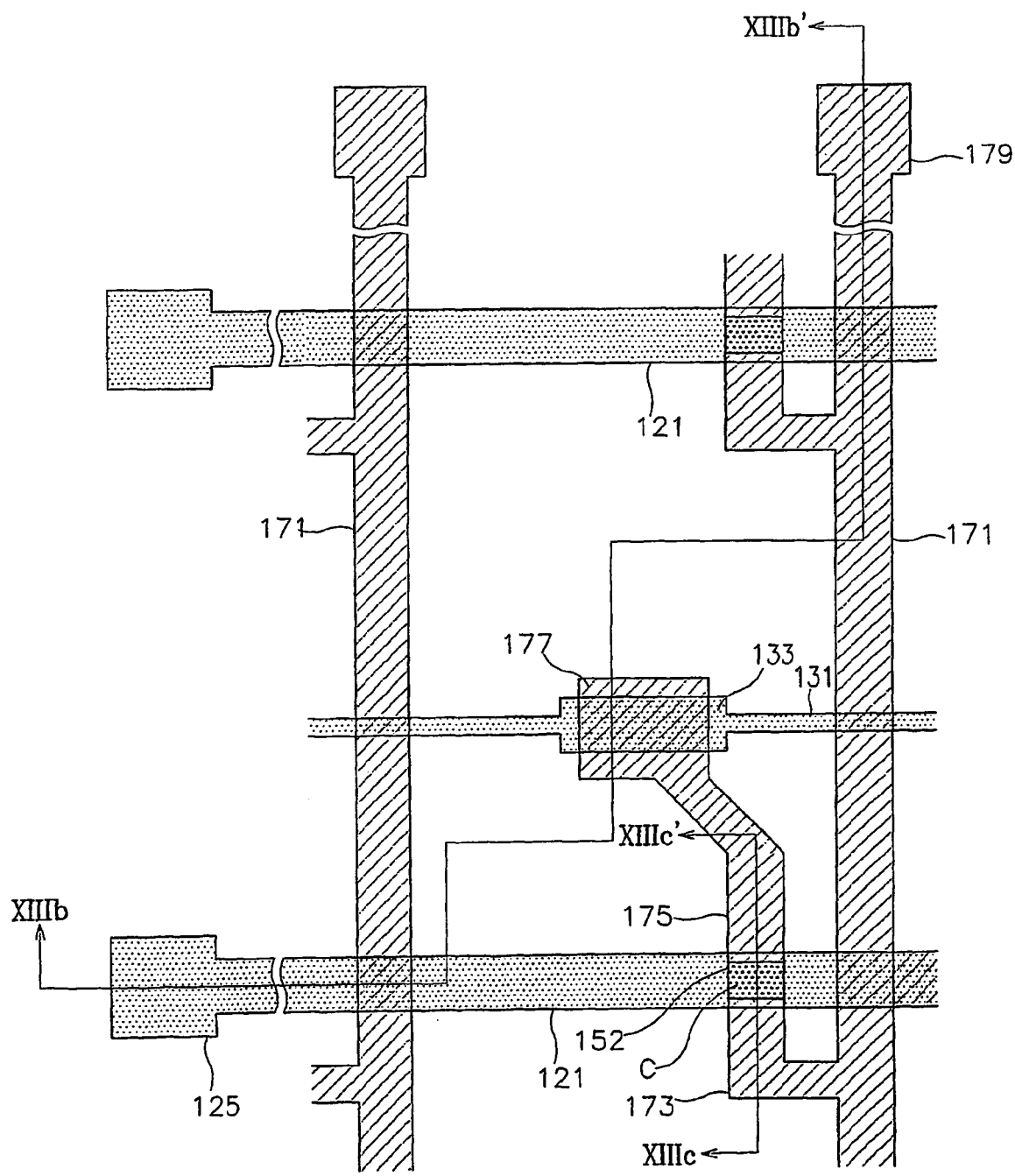
FIG. 13A is a layout view of the TFT array panel in the step following the step illustrated in FIGS. 12A and 12B.
Figure 13B:
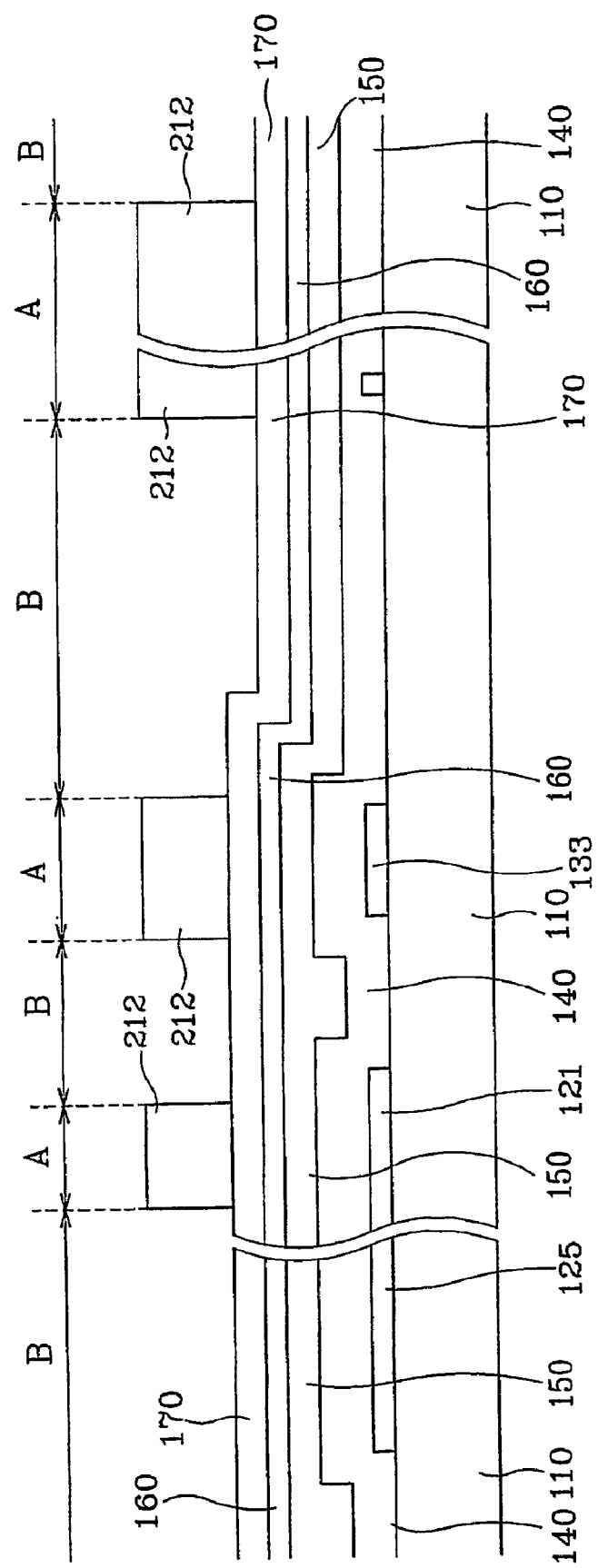
FIGS. 13B and 13C are sectional views of the TFT array panel shown in FIG. 13A taken along the line XIIIB–XIIIB' and the line XIIIC–XIIIC', respectively.
Figure 13C:
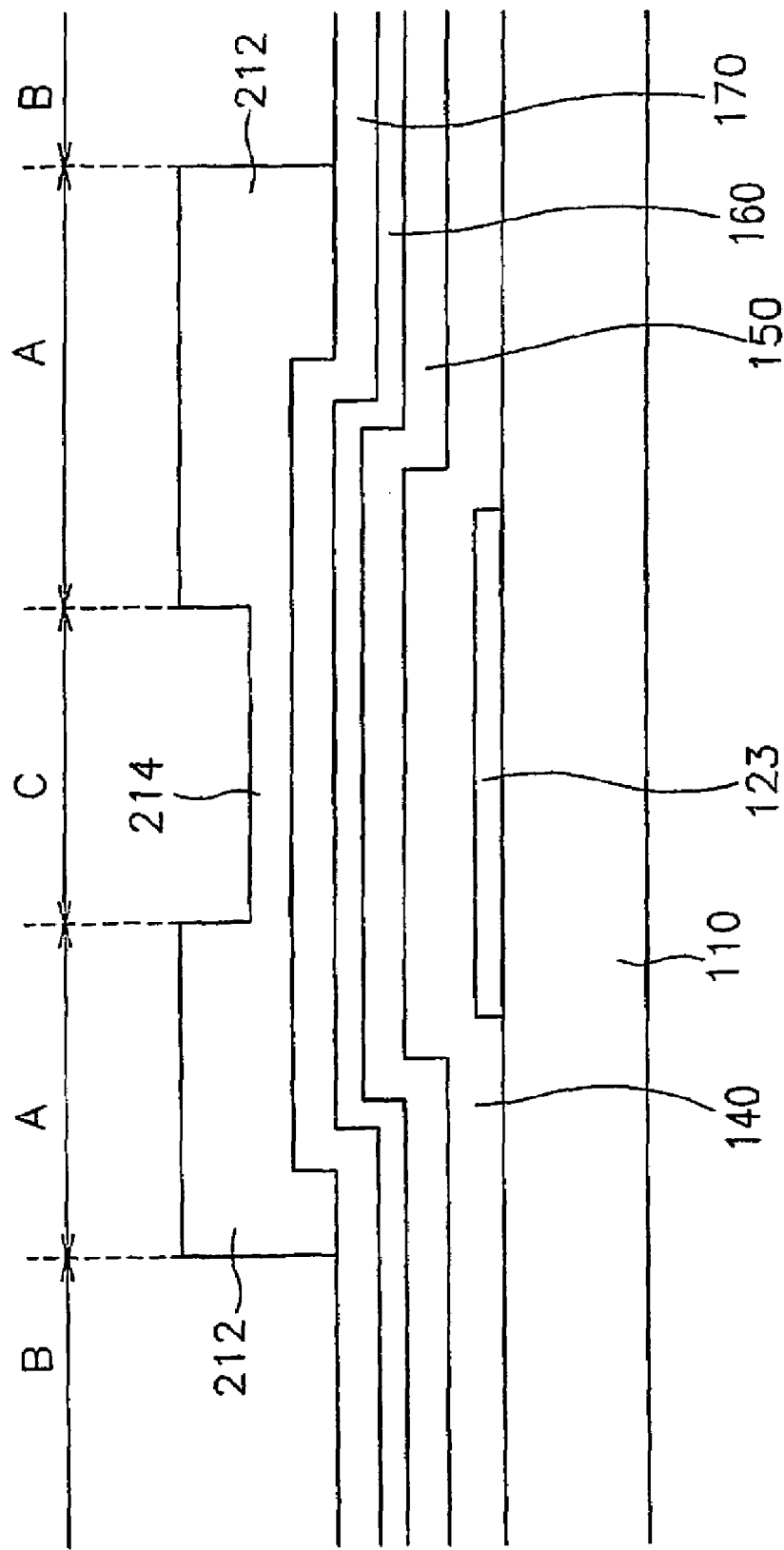

Thereafter, the photoresist film 210 is exposed to light through a mask and is developed to form a photoresist pattern having a plurality of first portions 214 and a plurality of second portions 212 as shown in FIGS. 13B and 13C. Each of the first portions 214 of the photoresist pattern 212 and 214 is located on the channel area C of a TFT, which is placed between a source electrode 173 and a drain electrode 175. Each of the second portions 212 is located on a data area A located at a place where a data wire 171, 173, 175, 177 and 179 will be formed. All portions of the photoresist film 210 on the remaining areas B are removed, and the first portions 214 are made to be thinner than the second portions 212. Here, the ratio of the thickness of the first portion 214 on the channel area C and the second portion 212 on the data area A is adjusted depending on process conditions of subsequent etching steps described later, and it is preferable that the thickness of the first portion 214 is equal to or less than a half of that of the second portion 212, for example, equal to or less than 4,000 Å.

The position-dependent thickness of the photoresist pattern 212 and 214 are obtained by several techniques. A slit pattern, a lattice pattern or a translucent film is provided on the mask in order to adjust the light transmittance in the area C.

When using a slit pattern, it is preferable that width of the slits or distance between the slits is smaller than the resolution of an exposer used for the photolithography. In case of using a translucent film, thin films with different transmittances or different thickness may be used to adjust the transmittance on the masks.

When a photoresist film 210 is exposed to light through such a mask, polymers of a portion directly exposed to the light are almost completely decomposed, and those of a portion exposed to the light through a slit pattern or a translucent film are not completely decomposed because the amount of a light irradiation is small. The polymers of a portion of the photoresist film 210 blocked by a light-blocking film provided on the mask is hardly decomposed. After the photoresist film 210 is developed, the portions containing the polymers, which are not decomposed, is left. At this time, the thickness of the portion with less light exposure is thinner than that of the portion without light exposure. Since too long exposure time decomposes all the molecules, it is necessary to adjust the exposure time.

The first portion 214 of the photoresist pattern may be obtained using reflow. That is, the photoresist film is made of a reflowable material and exposed to light through a normal mask having opaque and transparent portions. The photoresist film is then developed and subject to reflow such that portions of the photoresist film flows down onto areas without photoresist, thereby forming the thin portion.

Next, the photoresist film 212 and 214 and the underlying layers including the conductive layer 170, the intermediate 160 and the semiconductor layer 150 are etched such that the data wire and the underlying layers are left on the data areas A, only the semiconductor layer is left on the channel areas C, and all the three layers 170, 160 and 150 are removed to expose the gate insulating layer 140 on the remaining areas B.

Figure 14A:
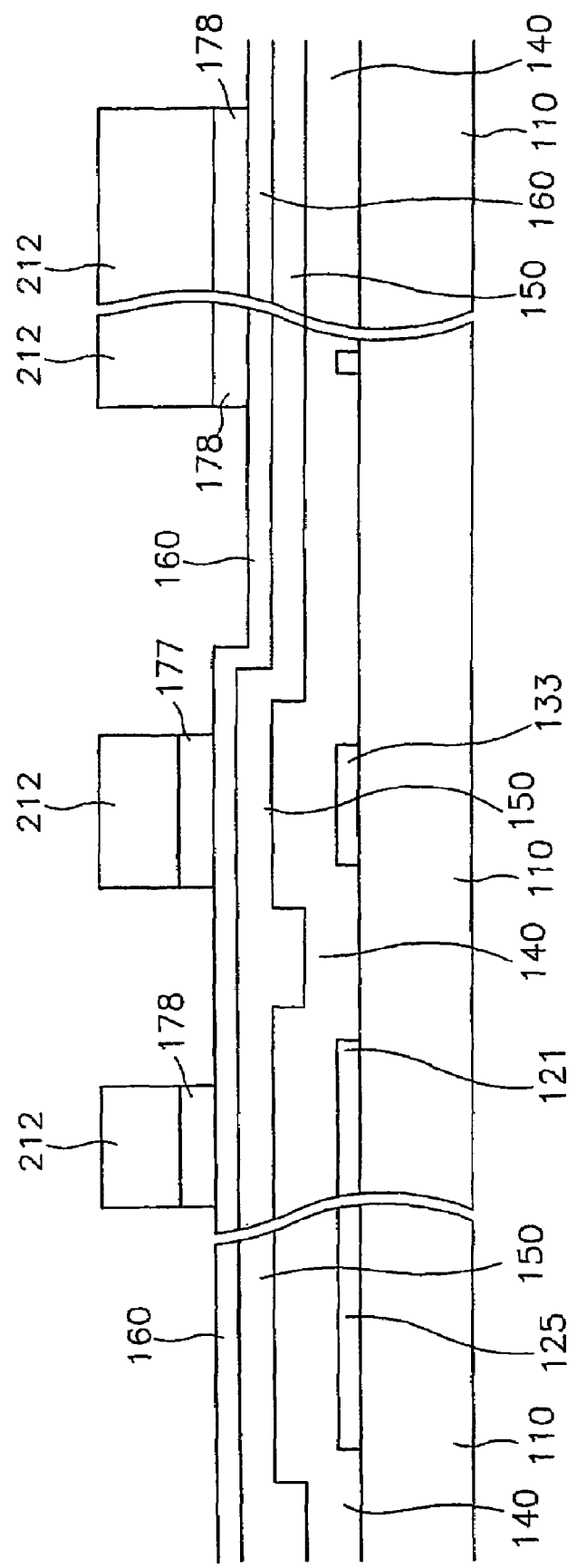
FIGS. 14A, 15A and 16A and FIGS. 14B, 15B and 16B are sectional views of the TFT array panel shown in FIG. 13A taken along the line XIIIB–XIIIB' and the line XIIIC–XIIIC', respectively, sequentially illustrating the steps following the step illustrated in FIG. 13B and FIG. 13C.
Figure 14B:
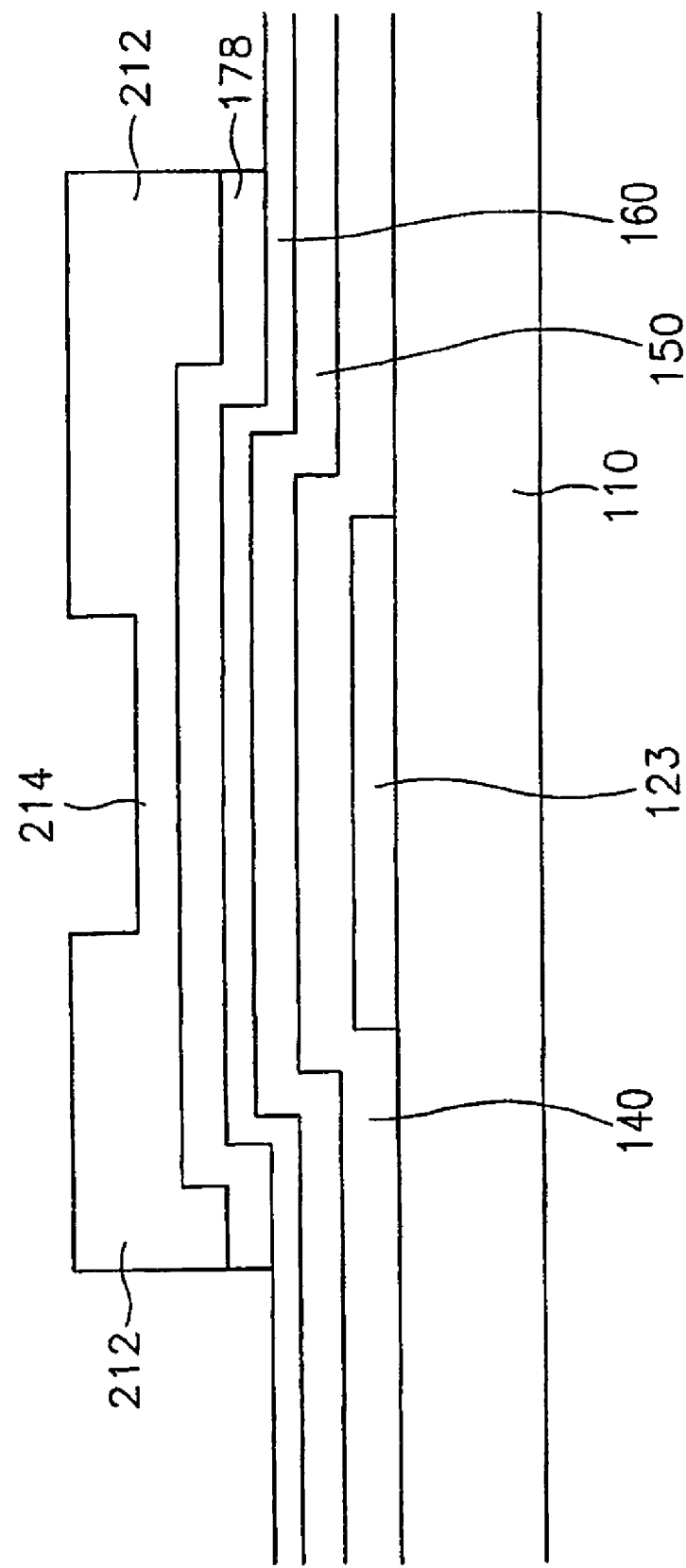

First, as shown in FIGS. 14A and 14B, the exposed portions of the conductive layer 170 on the other areas B are removed to expose the underlying portions of the intermediate layer 160. Both dry etch and wet etch are selectively used in this step and preferably performed under the condition that the conductive layer 170 is easily etched and the photoresist pattern 212 and 214 are hardly etched. However, since it is hard to identify the above-described condition for dry etch, and the dry etch may be performed under the condition that the photoresist pattern 212 and 214 and the conductive layer 170 are etched simultaneously. In this case, the first portion 214 for dry etch is preferably made to be thicker than that for the wet etch to prevent the removal of the first portion 214 and thus the exposure of the underlying portions of the conductive layer 170.

As a result, as shown in FIG. 14A and FIG. 14B, only the portions of the conductive layer 170 on the channel areas C and the data areas A, that is, the source/drain ("S/D") conductors 178 and the storage capacitor conductors 177 are left and the remaining portions of the conductive layer 170 on the remaining areas B are removed to expose the underlying portions of the intermediate layer 160.

Here, the S/D conductors 177 have substantially the same planar shapes as the data wire 171, 173, 175, 177 and 179 except that the source electrodes 173 and the drain electrodes 175 are not disconnected from but connected to each other. When using dry etch, the thickness of the photoresist pattern 212 and 214 is reduced to an extent.

Figure 15A:
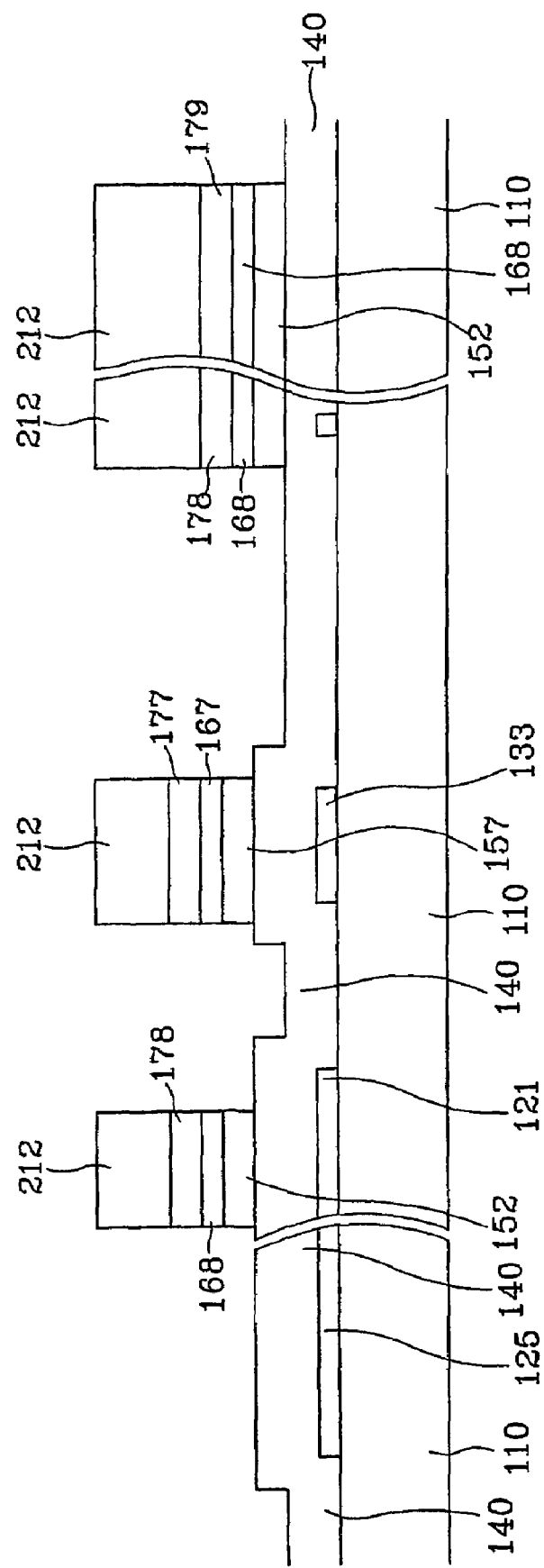
Figure 15B:
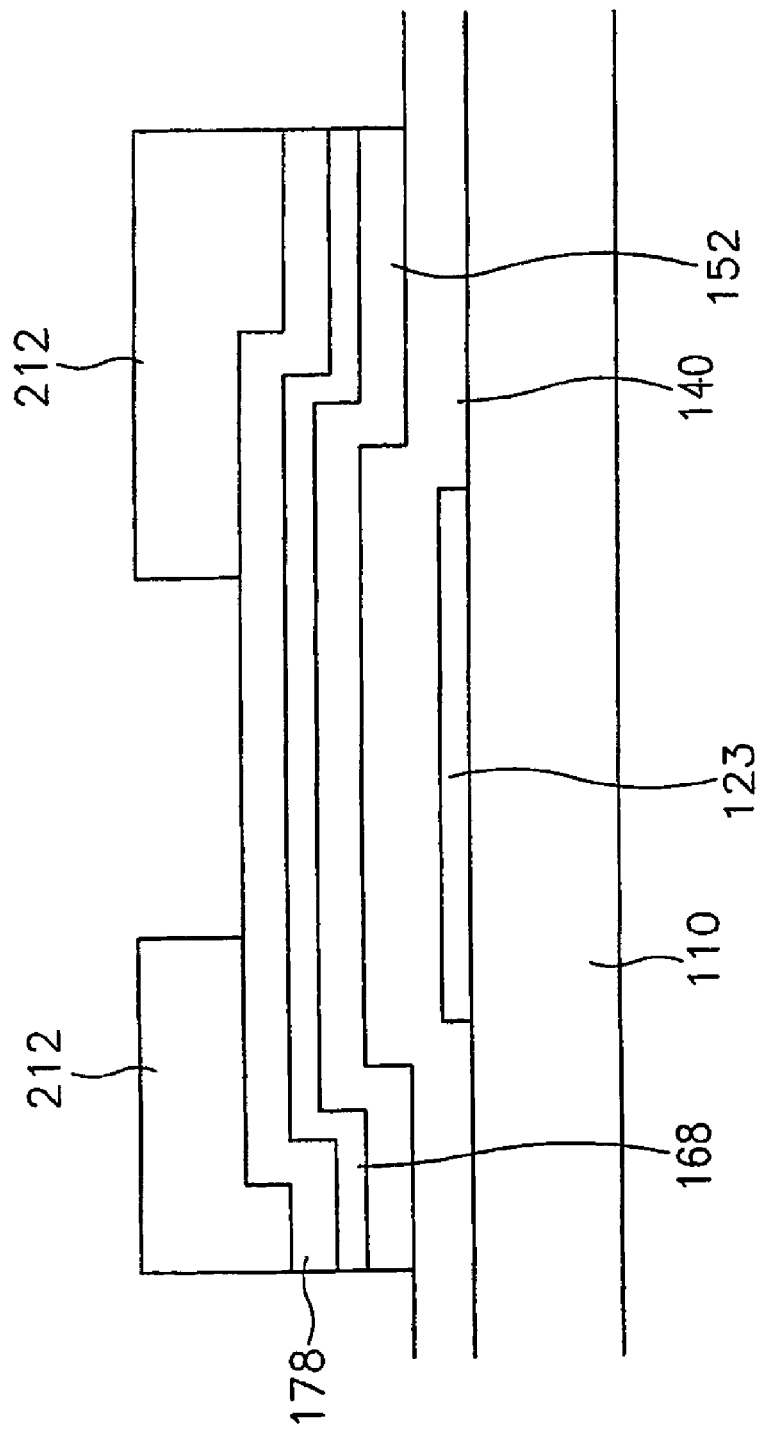

Next, as shown in FIG. 15A and FIG. 15B, the exposed portions of the intermediate layer 160 and the underlying portions of the semiconductor layer 150 on the areas B as well as the first portion 214 of the photoresist pattern 212 and 214 are removed by dry etch. The etching is performed under the condition that the photoresist pattern 212 and 214, the intermediate layer 160 and the semiconductor layer 150 are easily etched and the gate insulating layer 140 is hardly etched. (It is noted that etching selectivity between the intermediate layer and the semiconductor layer is nearly zero.) In particular, it is preferable that the etching ratios for the photoresist pattern 212 and 214 and the semiconductor layer 150 are nearly the same. For instance, the etched thicknesses of the photoresist pattern 212 and 214 and the semiconductor layer 150 can be nearly the same by using a gas mixture of $SF_6$ and HCl, or a gas mixture of $SF_6$ and $O_2$.

When the etching ratios for the photoresist pattern 212 and 214 and for the semiconductor pattern 150 are the same, the initial thickness of the first portion 214 is equal to or less than the sum of the thickness of the semiconductor layer 150 and the thickness of the intermediate layer 160.

Consequently, as shown in FIGS. 15A and 15B, the first portions 214 on the channel areas C are removed to expose the underlying portions of the S/D conductors 178, and the portions of the intermediate layer 160 and the semiconductor layer 150 on the remaining areas B are removed to expose the underlying portions of the gate insulating layer 140. In the meantime, the second portions 212 on the data areas A are also etched to become thinner. Moreover, the semiconductor pattern 152 and 157 is completed in this step. The reference numerals 168 and 167 refer to S/D ohmic contacts under the S/D conductors 178 and storage-capacitor ohmic contacts under the storage capacitor conductors 177, respectively.

Then, photoresist remnants left on the surface of the S/D conductors 178 on the channel areas C are removed by ashing.

Figure 16A:
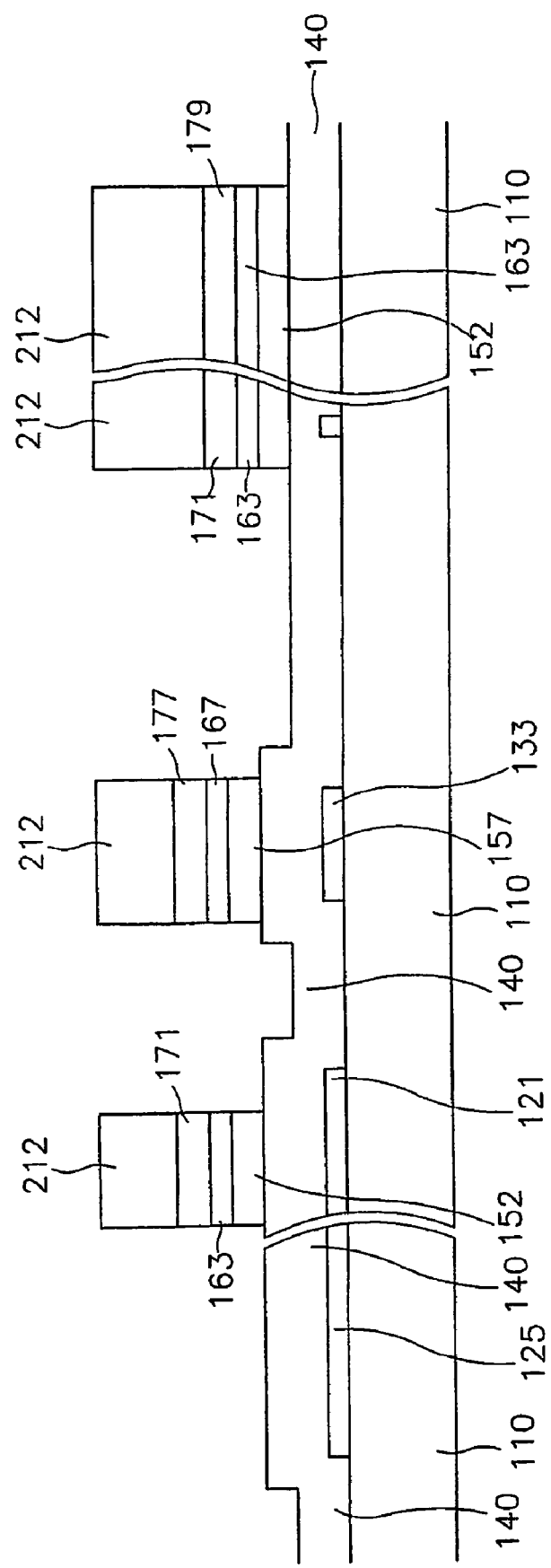
Figure 16B:
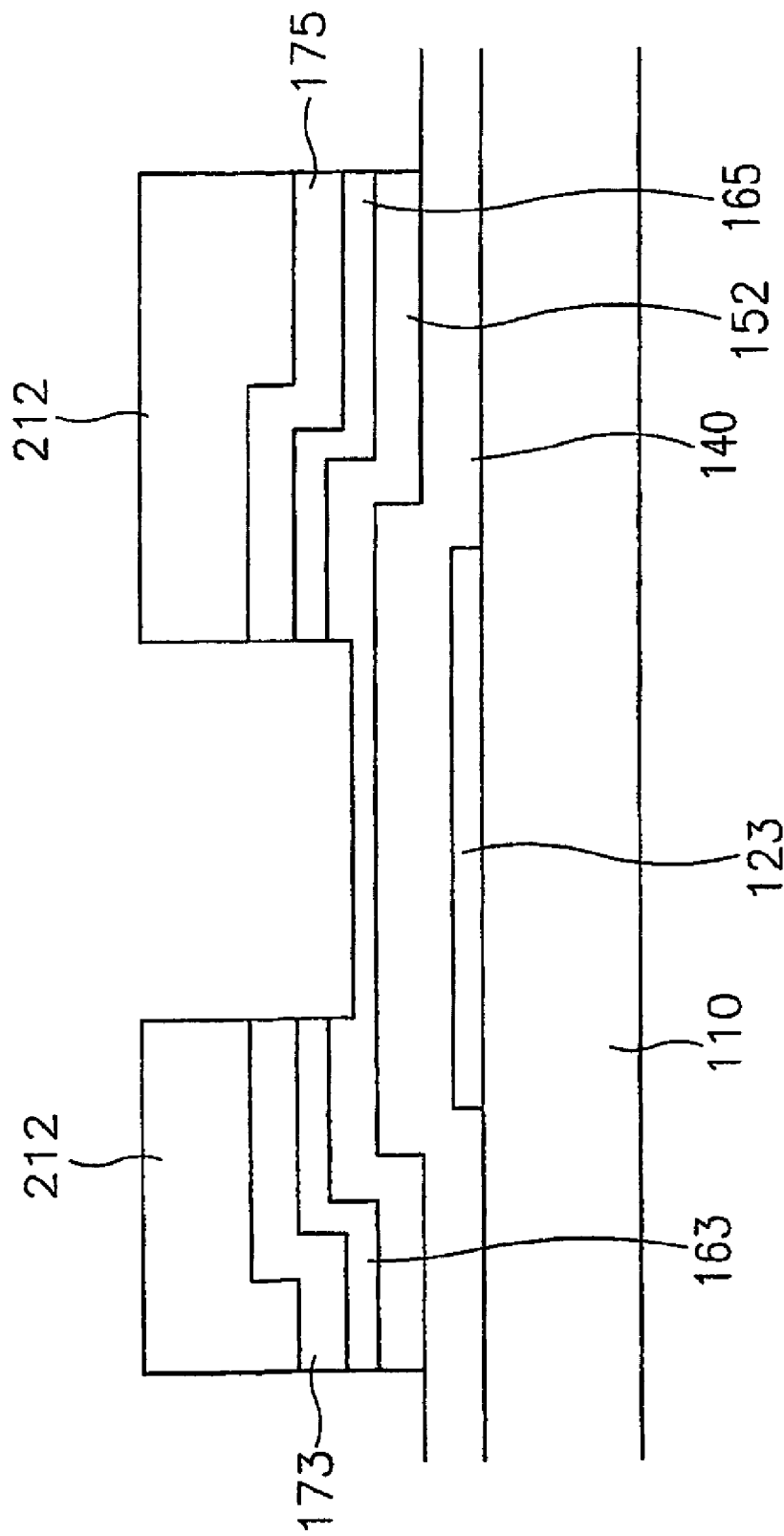

Next, as shown in FIGS. 16A and 16B, portions of the S/D conductors 178 and the underlying portions of the S/D ohmic contacts 168 on the channel areas C are etched to be removed. Here, the etching of both the S/D conductors 178 and the S/D ohmic contacts 168 may be done using only dry etching. Alternatively, the S/D conductors 178 are etched by wet etching and the S/D ohmic contacts 168 are etched by dry etching. In the former case, it is preferable to perform the etching under the condition that etching selectivity between the S/D conductors 178 and the S/D ohmic contacts 168 is high It is because the low etching selectivity makes the determination of the etching finish point difficult, thereby causing the adjustment of the thickness of the portions of the semiconductor pattern 152 left on the channel areas C to be difficult. In the latter case alternately applying wet etching and dry etching, a stepwise lateral sidewall is formed since the wet etch etches the lateral sides of the S/D conductors 178, while the dry etch hardly etches the lateral sides of the S/D ohmic contacts 168. Examples of etching gases used for etching the S/D ohmic contacts 168 are a gas mixture of $CF_4$ and HCl and a gas mixture of $CF_4$ and $O_2$. Use of the gas mixture of CF4 and O2 enables to obtain uniform thickness of etched portions of the semiconductor pattern 152 and 157. In this regard, as shown in FIG. 16B, the exposed portions of the semiconductor pattern 152 and 157 are etched to have a reduced thickness, and the second portions 212 of the photoresist pattern 212 and 214 are also etched to have a reduced thickness. This etching is performed under the condition that the gate insulating layer 140 is not etched, and it is preferable that the photoresist pattern 212 and 214 is thick enough to prevent the second portions 212 from being removed to expose the underlying portions of the data wire 171, 173, 175, 177 and 179.

Accordingly, the source electrodes 173 and the drain electrodes 175 are separated from each other, and, simultaneously, the data wire 171, 173, 175, 177 and 179 and the ohmic contact pattern 163, 165 and 167 thereunder are completed.

Finally, the second portions 212 of the photoresist pattern 212 and 214 left on the data areas A are removed. Alternatively, the second portions 212 are removed after the portions of the S/D conductors 178 on the channel areas C are removed and before the underlying portions of the S/D ohmic contacts 168 are removed.

As described above, wet etching and dry etching may be performed one after the other, but only dry etching may be used. The latter is relatively simple but it is not easy to find a proper etching condition compared with the former. On the contrary, it is easy to find a proper etching condition for the former case but the former is relatively complicated compared with the latter.

Figure 17A:
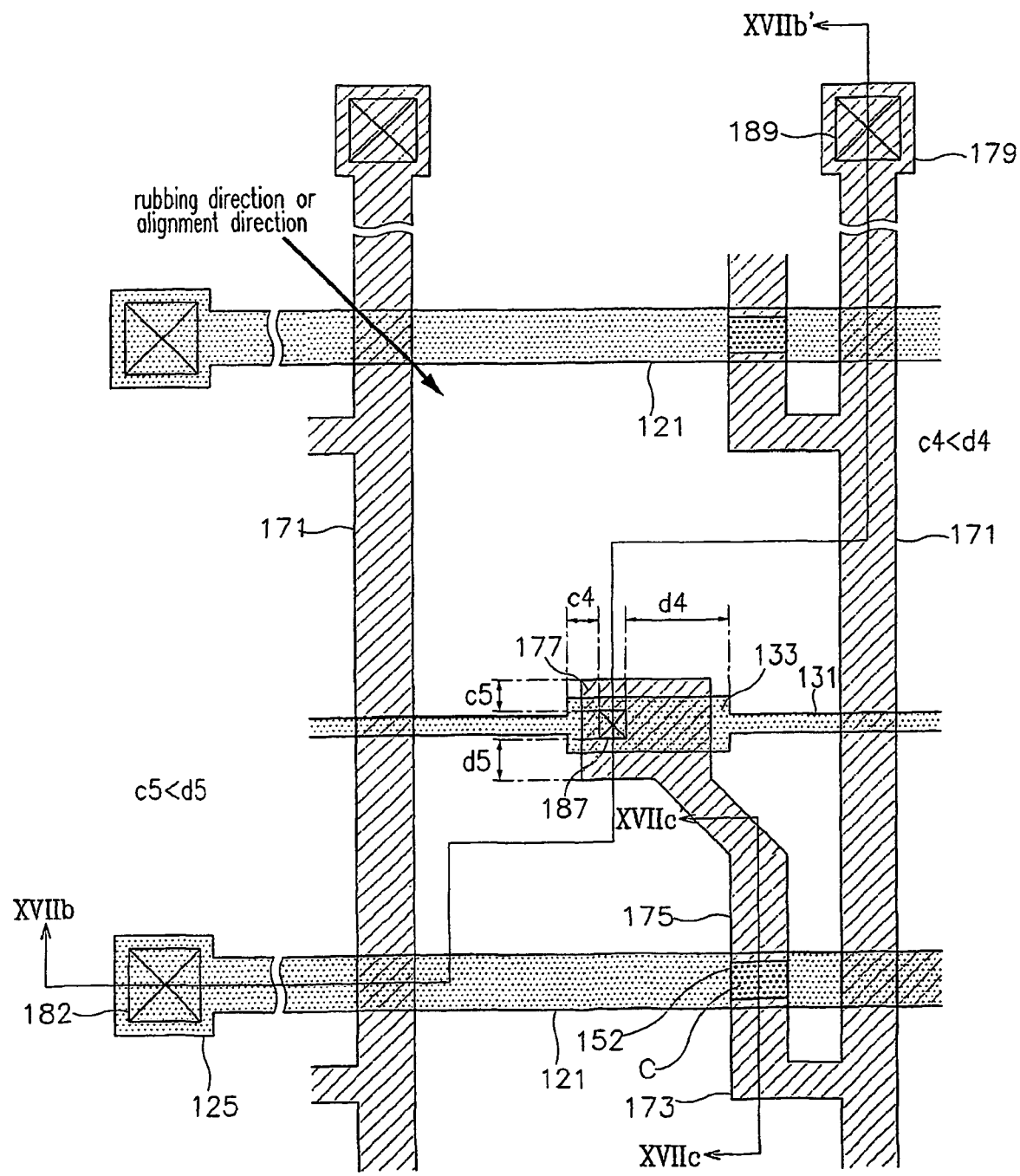
FIG. 17A is a layout view of the TFT array panel in the step following the step illustrated in FIGS. 16A and 16B.
Figure 17C:
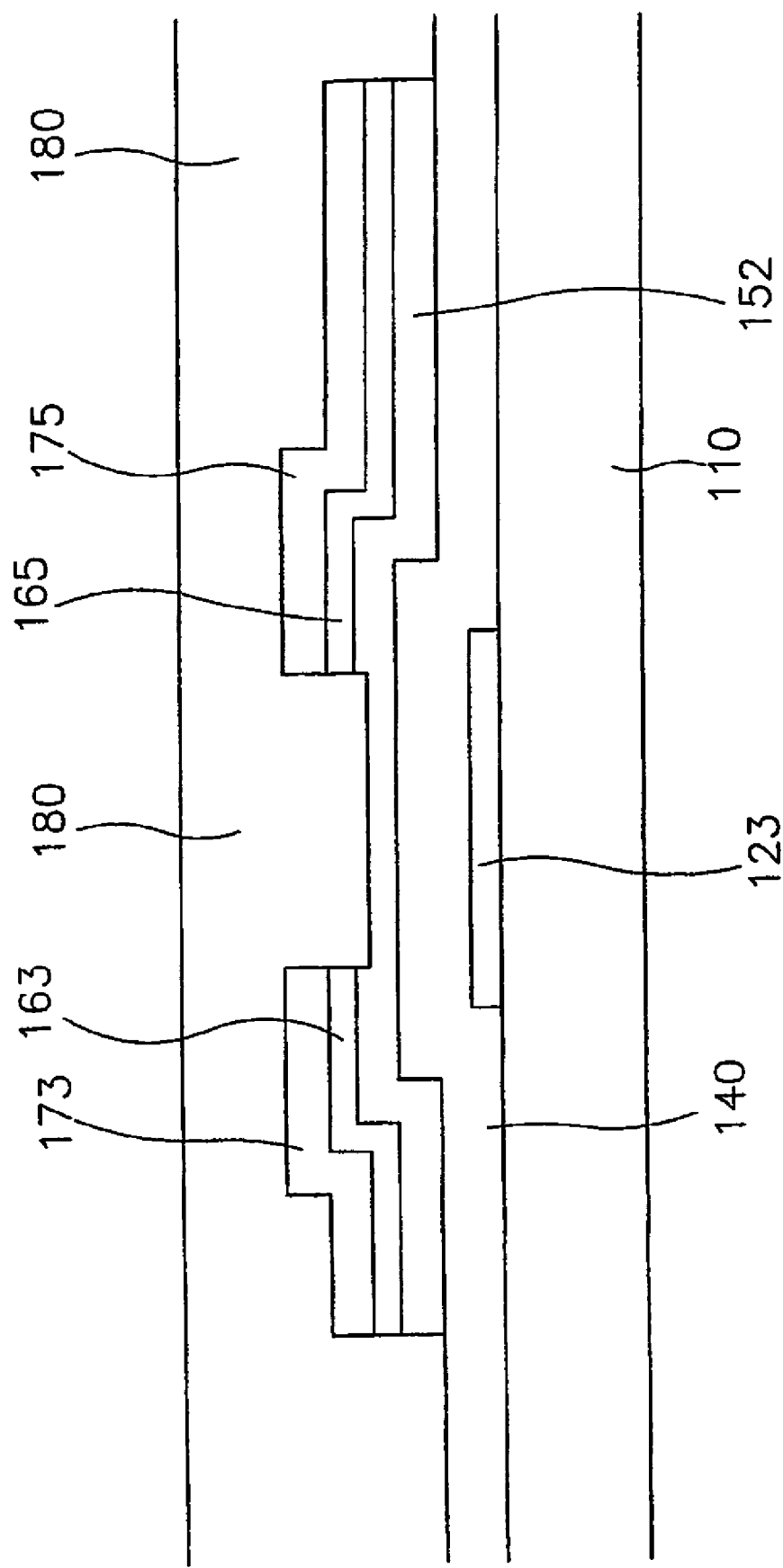

Thereafter, a passivation layer 180 is formed by depositing insulating material like the first embodiment As shown in FIGS. 17A to 17C, the passivation layer 180 together with the gate insulating layer 140 is etched using a mask to form a plurality of contact holes 185, 182, 187 and 189 exposing the drain electrodes 175, the gate pads 125, the storage capacitor conductors 177, and the data pads 179.

Finally, as shown in FIGS. 8 to 10, an ITO layer or an IZO layer with a thickness of 1500–500 Å is deposited and etched using a mask to form a plurality of pixel electrodes 190 connected to the drain electrodes 175 and the storage capacitor conductors 177, a plurality of subsidiary gate pads 92 connected to the gate pads 125, and a plurality of subsidiary data pads 97 connected to the data pads 179.

Since the data wire 171, 173, 175, 177 and 179, the ohmic contact pattern 163, 165 and 167 thereunder and the semiconductor pattern 152 and 157 thereunder are formed using a single mask, and the source electrode 173 and the drain electrode 175 are separated from each other in this process, the second embodiment of the present invention gives a simple manufacturing method as well as the advantage which the first embodiment gives.

The configuration of the contact portion according to the present invention is also applicable to COA (color filter on array) structure providing color filters on a TFT array panel. This will be described in detail with reference to the drawings.

Figure 18:
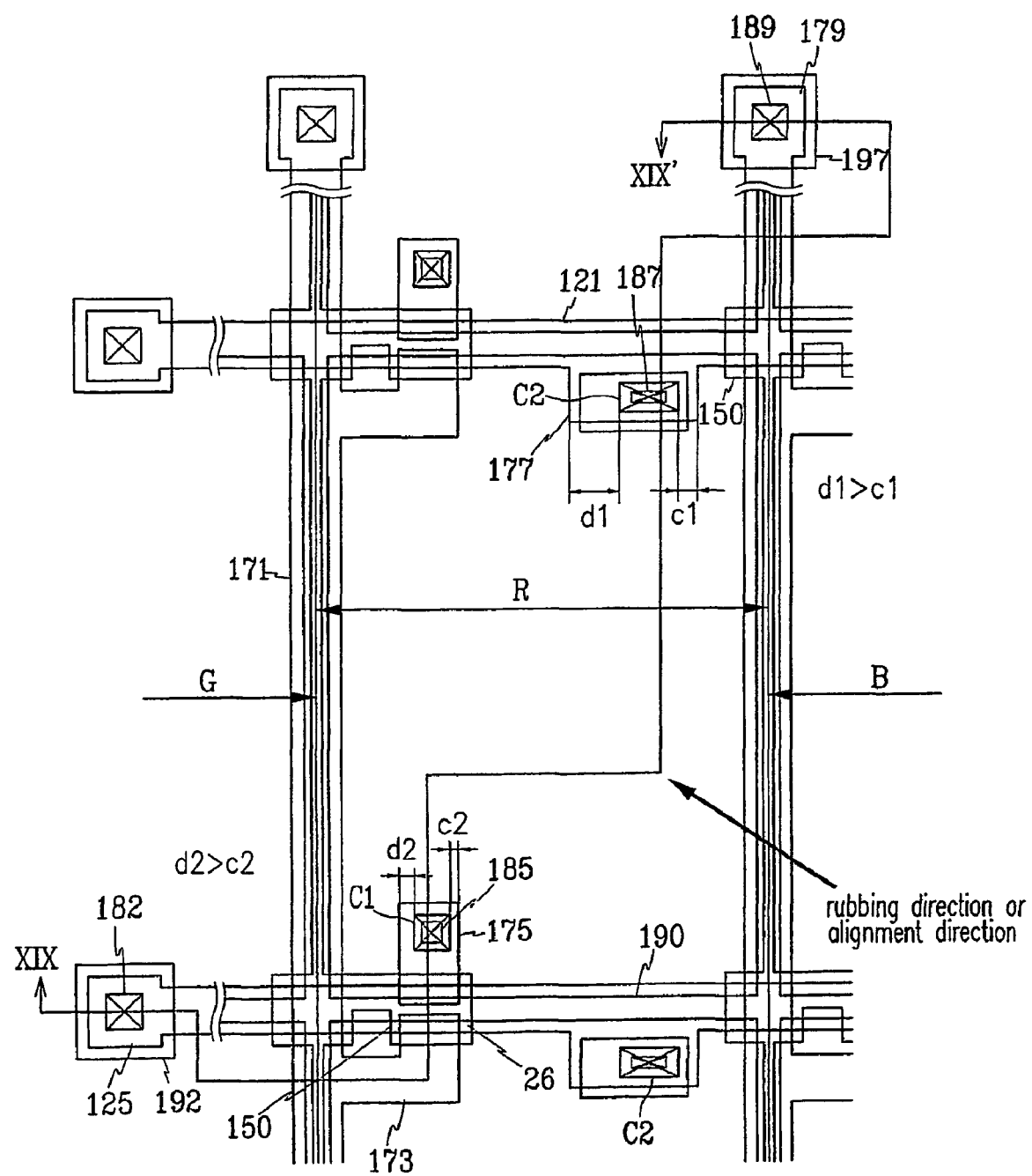
FIG. 18 is a layout view of a TFT array panel for an LCD according to a third embodiment of the present invention.
Figure 19:
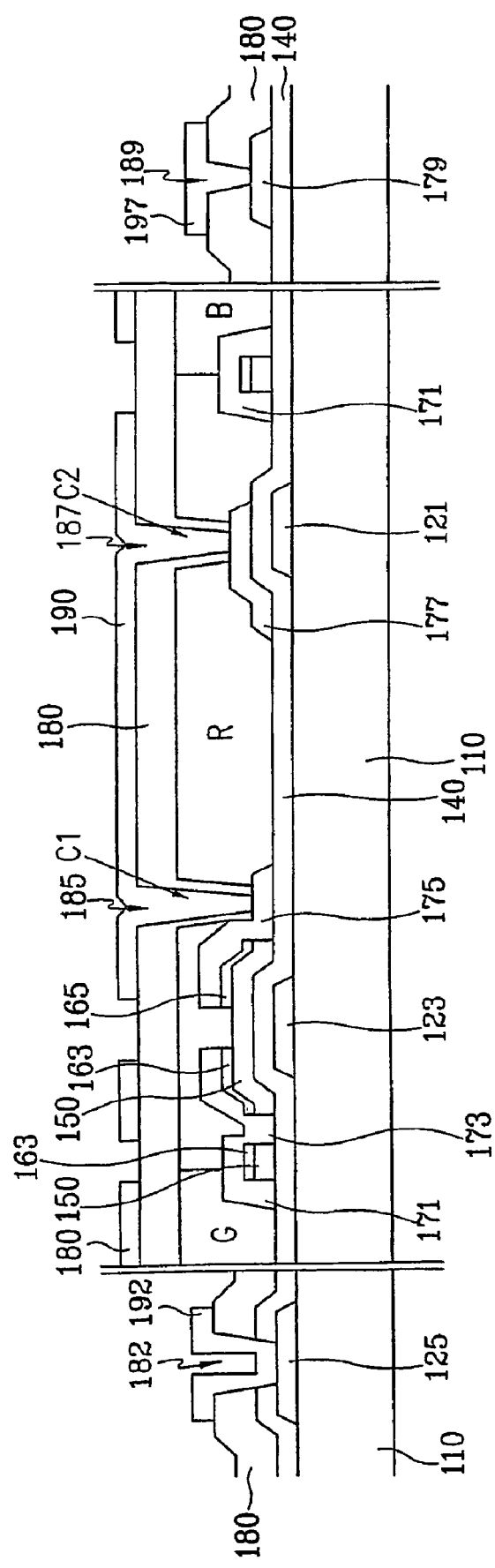
FIG. 19 is a sectional view of the TFT array panel shown in FIG. 18 taken along the line XIX–XIX'.

FIG. 18 is a layout view of a TFT array panel for an LCD according to a third embodiment of the present invention, and FIG. 19 is a sectional view of the TFT array panel shown in FIG. 18 taken along the line XIX–XIX'.

Most of the structure is substantially the same as that of the first embodiment.

However, a plurality of red, green and blue color filters of R, G and B extending in a longitudinal direction are formed in respective pixel areas under a passivation layer 180. The color filters R, G and B have a plurality of apertures C1 and C2 exposing a plurality of drain electrodes 173 and a plurality of storage capacitor conductors 177, respectively. In this embodiment, the boundaries of the color filters R, G and B are shown to coincide with each other and to be located on a plurality of data lines 171. However, the color filters R, G and B may overlap each other on the data lines 171 to block the light leakage between the pixel areas. The color filters R, G and B are not formed near pad areas provided with a plurality of gate pads 125 and a plurality of data pads 179.

The passivation layer 180 formed on the color filters R, G and B along with the gate insulating layer 140 has a plurality of contact holes 182, 185, 187 and 189 exposing the gate pads 125, the drain electrodes 175, the storage capacitor conductors 177, and the data pads 179, respectively. The contact holes 185 and 187 exposing the drain electrodes 175 and the storage capacitor conductors 177 are located within the apertures C1 and C2 of the color filters R, G and B.

The TFT array panel for an LCD having a COA structure can give the equal effect as those of the first and the second embodiments.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

As described above, the present invention designs the boundaries of the contact holes at the portions where alignment treatment or rubbing ends to be wider than those at the other portions. In this way, the aperture ratio of the pixels is secured and the light leakage is block by the wire with optimum condition.

What is claimed is:

1. A thin film transistor array panel comprising:
   an insulating substrate;
   an opaque film formed on the insulating substrate;
   an insulating layer covering the opaque film and having a contact hole exposing the opaque film at least in part at a contact portion and having a plurality of boundaries, at least a portion of the boundaries located inside boundaries of the opaque film; and
   a conductive layer formed on the insulating layer and connected to the opaque film through the contact hole,
   wherein a distance between one of the boundaries of the contact hole of the contact portion at a place where alignment treatment or rubbing ends and one of the boundaries of the opaque film located outside the contact hole is wider than a distance between the boundaries of the contact holes at other places and the boundaries of the opaque film.

2. The thin film transistor array panel of claim 1, wherein the opaque film comprises a first wire and a second wire insulated from and overlapping the first wire and the second wire is exposed through the contact hole.

3. The thin film transistor array panel of claim 2, wherein one of boundaries of the first wire and the second wire is located outside the boundaries of the contact hole at the place where alignment treatment or rubbing ends.

4. The thin film transistor array panel of claim 3, wherein the first wire is either a gate wire or a storage capacitor wire, the second wire is either a data wire or a storage capacitor conductor, and the conductive layer is a pixel electrode made of transparent conductive material.

5. The thin film transistor array panel of claim 4, wherein the gate wire comprises a gate line and a gate electrode connected to the gate line, and the data wire comprises a data line intersecting the gate line, a source electrode connected to the data line and placed close to the gate electrode, and a drain electrode opposite the source electrode with respect to the gate electrode.

6. The thin film transistor array panel of claim 5, further comprising a gate insulating layer covering the gate wire, and a semiconductor layer formed on the gate insulating layer between the gate electrode and the source electrode and the drain electrode.

7. The thin film transistor array panel of claim 6, wherein the semiconductor layer has the same shape as the data wire except for a channel portion between the source electrode and the drain electrode.

8. The thin film transistor array panel of claim 4, wherein the storage capacitor wire comprises a storage capacitor line separated from the gate wire and a storage electrode connected to the storage capacitor line.

9. The thin film transistor array panel of claim 8, wherein the storage capacitor conductor is connected to the data wire.

10. The thin film transistor array panel of claim 1, wherein the insulating film comprises silicon nitride, organic insulating material or a low dielectric CVD film.

* * * * *